(12) United States Patent
Kuwazawa

(10) Patent No.: US 7,132,705 B2
(45) Date of Patent: *Nov. 7, 2006

(54) SOLID STATE IMAGING DEVICE AND METHOD OF DRIVING THE SAME

(75) Inventor: Kazunobu Kuwazawa, Chino (JP)

(73) Assignee: Seiko Epson Corporation (JP)

( * ) Notice: Subject to any disclaimer, the term of this patent is extended or adjusted under 35 U.S.C. 154(b) by 233 days.

This patent is subject to a terminal disclaimer.

(21) Appl. No.: 10/936,228

(22) Filed: Sep. 8, 2004

(65) Prior Publication Data

US 2005/0087773 A1    Apr. 28, 2005

(30) Foreign Application Priority Data

Sep. 9, 2003    (JP) .............................. 2003-316881

(51) Int. Cl.
  *H01L 27/00* (2006.01)
  *H01L 31/062* (2006.01)
  *H04N 3/14* (2006.01)

(52) U.S. Cl. ...................... 257/292; 257/292; 257/291; 348/297; 250/208.1; 382/254

(58) Field of Classification Search ................ 257/292, 257/291, 299, 402; 348/300, 308, 294, 297, 348/299; 250/208.1, 214.1; 382/254, 275, 382/304

See application file for complete search history.

(56) References Cited

U.S. PATENT DOCUMENTS 6,448,596 B1 * 9/2002 Kawajiri et al. ............ 257/292
6,512,547 B1 * 1/2003 Miida .......................... 348/310
6,784,934 B1 * 8/2004 Watanabe .................... 348/308
6,946,638 B1 * 9/2005 Kuwazawa et al. ...... 250/208.1

FOREIGN PATENT DOCUMENTS

| JP | 11-205689 A | 7/1999 |
| JP | 2001-145024 A | 5/2001 |
| JP | 2001-238132 A | 8/2001 |
| JP | 2002-134729 | 5/2002 |
| JP | 2002-134729 A | 5/2002 |
| JP | 2003-017677 A | 1/2003 |

\* cited by examiner

*Primary Examiner*—Long Pham
*Assistant Examiner*—Shrininvas H. Rao
(74) *Attorney, Agent, or Firm*—Harness, Dickey & Pierce, P.L.C.

(57) ABSTRACT

A solid state imaging device including: a photoelectric conversion element generating photo-generated charges corresponding to incident light; an accumulation well accumulating photo-generated charges; a modulation well storing photo-generated charges from the accumulation well; a modulation transistor whose channel threshold voltage is controlled by the stored photo-generated charges and that outputs a pixel signal corresponding to the photo-generated charges; a transfer control element changing the potential barrier of a transfer channel between the accumulation well and the modulation well to control transfer of the photo-generated charges; and an unwanted charges discharge control element controlling the potential barrier of an unwanted charges discharge channel coupled to the accumulation well, and discharging charges which overflow from the accumulation well through the unwanted charges discharge channel during all periods other than the transfer period when photo-generated charges are transferred from the accumulation well to the modulation well.

8 Claims, 17 Drawing Sheets

FIG. 7A
FIG. 7B
FIG. 7C
FIG. 7D
FIG. 7E

SOLID STATE IMAGING DEVICE AND
METHOD OF DRIVING THE SAME

RELATED APPLICATIONS

This application claims priority to Japanese Patent Application No. 2003-316881 filed Sep. 9, 2003, which is hereby expressly incorporated by reference herein in its entirety.

BACKGROUND

1. Field of the Invention

The present invention relates to a solid state imaging device having a high quality picture and low power consumption, and a method of driving the same.

2. Description of Related Art

Solid state imaging devices carried in cellular phones or the like include a CCD (charge coupled device) type image sensor and a CMOS type image sensor. The CCD type image sensor is excellent in picture quality, and the CMOS type image sensor consumes lower power and its process cost is low. In recent years, MOS type solid state imaging devices using a threshold voltage modulation method which combines both a high quality picture and low power consumption have been proposed. A MOS type solid state imaging device using the threshold voltage modulation method is disclosed in Japanese Unexamined Patent Publication No. 2002-134729, for example.

In the solid state imaging device of Japanese Unexamined Patent Publication No. 2002-134729, the picture output is obtained by arranging unit pixels in a matrix form and repeating three states of initialization, accumulation, and reading. Moreover, in the solid state imaging device of Japanese Unexamined Patent Publication No. 2002-134729, each unit pixel has a photo-diode, a modulation transistor, and an overflow drain gate. The gate of the modulation transistor is formed in a ring shape.

Charges (photo-generated charges) generated by light incident upon the photo-diode are transferred to a P-type well region formed under a ring gate, and accumulated in a carrier pocket formed in this region. The threshold voltage of the modulation transistor changes corresponding to the photo-generated charges accumulated in the carrier pocket. Accordingly, a signal (pixel signal) corresponding to incident light is obtained from a terminal coupled to the source region of the modulation transistor.

In the solid state imaging device of Japanese Unexamined Patent Publication No. 2002-134729, in order to prevent distortion produced when imaging a moving object, a picture made by an optical signal is taken in on an entire light-receiving surface, and the optical signal is converted to an electric signal and output as a picture signal. However, in this reading method, an accumulating period and a reading period cannot be controlled for each pixel because the picture made by the optical signal is taken in on an entire light-receiving surface. Therefore, while specific pixels are being read, the accumulation operation cannot be carried out in other pixels, and as a result the frame rate cannot be increased.

Furthermore, in the solid state imaging device of Japanese Unexamined Patent Publication No. 2002-134729, a part of the photo-generated charges generated in the photo-diode is discharged to the substrate through the overflow-drain region formed in a P-type layer.

Incidentally, in an N-type layer which constitutes the photo-diode, as the peak of impurity concentration becomes deeper perpendicularly downward in the substrate, the wavelength range of photoelectric-convertible incident light becomes wider. That is, taking a higher quality picture into consideration, the depth of the N-type layer needs to be sufficiently deep. Meanwhile, the overflow-drain region is composed of a deep P-type layer extending from underneath an overflow drain gate to the rear surface of the substrate. This P-type layer is formed by implanting P-type impurities after forming the above-mentioned N-type layer. Therefore, in order to form the overflow-drain region composed of a deep P-type layer, the ion-implanting energy needs to be increased. Generally, the area of an impurity region formed with increased ion-implanting energy increases. That is, the area of the overflow-drain region will increase. Therefore, there is a tradeoff between a higher quality picture and miniaturization, and there is also a problem that a solid state imaging device cannot be miniaturized if the N layer is deepened for achieving a higher quality picture.

The present invention has been made in view of the above described problems, and is intended to provide a solid state imaging device and a method of driving the same which can attain a higher quality picture and miniaturization while speeding up the frame rate by allowing the accumulating period and the reading period to be set to a common timing.

SUMMARY

A solid state imaging device according to one aspect of the present invention comprises: a substrate; a photoelectric conversion element formed in the substrate and generating photo-generated charges corresponding to incident light; an accumulation well accumulating the photo-generated charges; a modulation well holding the photo-generated charges transferred from the accumulation well; a modulation transistor whose channel threshold voltage is controlled by the photo-generated charges held in the modulation well and that outputs a pixel signal corresponding to the photo-generated charges; a transfer control element changing a potential barrier of a transfer channel between the accumulation well and the modulation well so as to control transfer of the photo-generated charges, a control end of the transfer control element being common-coupled to a control end of the modulation transistor; and an unwanted charges discharge control element controlling a potential barrier of an unwanted charges discharge channel coupled to the accumulation well, the unwanted charges discharge control element discharging the photo-generated charges that overflow from the accumulation well through the unwanted charges discharge channel during a period other than a transfer period when the photo-generated charges are transferred from the accumulation well to the modulation well by the transfer control element.

According to the embodiment of the present invention, photo-generated charges generated by the photoelectric conversion element are accumulated in the accumulation well. The photo-generated charges accumulated in the accumulation well are transferred to the modulation well through the transfer channel. The channel threshold voltage of the modulation transistor is controlled by the photo-generated charges held in the modulation well such that a pixel signal corresponding to the photo-generated charges is outputted from the modulation transistor. The transfer control element can control transfer of the photo-generated charges by changing the potential barrier of the transfer channel. Moreover, the unwanted charges discharge control element controls the potential barrier of the unwanted charges discharge channel coupled to the accumulation well so as to discharge the charges that overflow from the accumulation well through the unwanted charges discharge channel during the period other than the transfer period when the photo-generated charges are transferred from the accumulation well to the modulation well by the transfer control element. Accordingly, in the period of reading a pixel signal from the modulation transistor, the photo-generated charges can be accumulated in the accumulation well while transfer of the photo-generated charges from the accumulation well to the modulation well is prevented. Moreover, the charges which are generated in the accumulation well when a strong light enters or the like are discharged to the outside through the unwanted charges discharge channel. Thus, even if the reading period and the accumulating period are set to a common timing, secured accumulation and reading can be attained. In addition, since the control end of the modulation transistor is common-coupled to the control end of the transfer control element, the modulation transistor and the transfer control element are commonly controlled with a signal sent from a common driving circuit via wiring coupled to these control ends. Accordingly, wiring and a driving circuit coupled to the modulation transistor and the transfer control element can be reduced such that the versatility in cell layout can be enhanced.

Moreover, the unwanted charges discharge control element determines an accumulating period of the photo-generated charges in the accumulation well by discharging the photo-generated charges accumulated in the accumulation well at a predetermined timing.

According to the embodiment of the present invention, the photo-generated charges are securely accumulated in the accumulation well by controlling the potential barrier of the transfer channel and the unwanted charges discharge channel. By discharging the photo-generated charges accumulated in the accumulation well at a predetermined timing, accumulation of the photo-generated charges in the accumulation well is initiated from this discharging timing. Accumulation of the photo-generated charges is completed by transferring the photo-generated charges accumulated in the accumulation well to the modulation well through the transfer channel in the transfer period. Thus, by discharging the photo-generated charges through the unwanted charges discharge channel, the accumulating period can be set without restraint, thereby enabling imaging not only in a normal mode but in a high-speed shutter mode and in a low-speed shutter mode.

Moreover, the unwanted charges discharge channel is coupled to external wiring with a terminal on the substrate therebetween.

According to the embodiment of the present invention, the charges accumulated in the accumulation well are discharged from the unwanted charges discharge channel to the external wiring via a terminal on the substrate. Therefore, it is not necessary to form a discharging channel by a diffusion layer in the depth direction of the substrate. Accordingly, even if the depth direction of the substrate in a photoelectric conversion element formation region is deepened for attaining higher quality picture, a large area is not needed in the discharging channel such that miniaturization can be attained.

A method of driving a solid state imaging device according to another aspect of the present invention is a method of driving a solid state imaging device including: an accumulation well that accumulates photo-generated charges generated by a photoelectric conversion element corresponding to incident light; a modulation well that controls a threshold voltage of a channel of a modulation transistor by holding the photo-generated charges; a transfer control element whose control end is common-coupled to a control end of the modulation transistor, and that controls a potential barrier of a transfer channel between the accumulation well and the modulation well; and an unwanted charges discharge control element that controls a potential barrier of an unwanted charges discharge channel coupled to the accumulation well. The method comprises: a single accumulation procedure for controlling the potential barrier of the transfer channel and the unwanted charges discharge channel with the transfer control element and the unwanted charges discharge control element, so as to accumulate the photo-generated charges by the photoelectric conversion element into the accumulation well at least so that the photo-generated charges do not flow to the modulation well through the transfer channel; and a reading procedure. The reading procedure comprises: a signal component modulation procedure for, in a state where the photo-generated charges are held in the modulation well by controlling the potential barrier of the transfer channel with the transfer control element, outputting a pixel signal corresponding to the photo-generated charges from the modulation transistor; a discharge procedure for discharging residual charges in the modulation well; and a noise component modulation procedure for controlling the potential barrier of the transfer channel with the transfer control element and reading a noise component from the modulation transistor after the discharge procedure. The method also comprises: a parallel accumulation procedure for, during the same period as the signal component modulation procedure, the discharge procedure, and the noise component modulation procedure, controlling the potential barrier of the transfer channel and the unwanted charges discharge channel with the transfer control element and the unwanted charges discharge control element so as to accumulate the photo-generated charges by the photoelectric conversion element into the accumulation well at least so that the photo-generated charges do not flow to the modulation well through the transfer channel; and a transfer procedure for controlling the potential barrier of the transfer channel with the transfer control element so as to transfer the photo-generated charges accumulated in the accumulation well to the modulation well and make the photo-generated charges be held therein.

According to the embodiment of the present invention, the photo-generated charges generated by the photoelectric conversion element are accumulated in the accumulation well in the single accumulation procedure, at least without flowing into the modulation well side. Moreover, the parallel accumulation procedure is carried out in the same period as the reading procedure including the signal component modulation procedure for outputting a pixel signal corresponding to the photo-generated charges from the modulation transistor, the discharging procedure for discharging the residual charges in the modulation well, and the noise component modulation procedure for reading a noise component from the modulation transistor after the discharging procedure. Accordingly, photo-generated charges by the photoelectric conversion element will be accumulated in the accumulation well, at least without flowing into the modulation well through the transfer channel. The photo-generated charges accumulated in the accumulation well in these single accumulation procedures and parallel accumulation procedure are transferred to the modulation well and held therein in transfer procedure. The reading corresponding to the photo-generated charges held in the modulation well is carried out in the reading procedure. During the reading period in the reading procedure, accumulation of the photo-generated charges is carried out simultaneously, thereby enabling speeding up of the frame rate. Furthermore, the modulation transistor and the transfer control element can be controlled with a common driving circuit that supplies a signal to the control ends thereof such that a vertical driving circuit block can be reduced. In addition, since the number of wiring can be reduced in cell layout, miniaturization of unit pixel, enhancement of sensitivity attributed to enlargement of a light-receiving element area or the like can be facilitated.

The transfer procedure is carried out after the single accumulation procedure and the parallel accumulation procedure carried out in the same period as the reading procedure are repeated the number of times based on the number of lines per one screen.

According to the embodiment of the present invention, accumulation operation in the single accumulation procedure and the parallel accumulation procedure are carried out at the same time of reading all lines that is carried out from the transfer procedure to the following transfer procedure. Accumulation in one screen period except the transfer period can be carried out.

Moreover, the method further comprises an initialization procedure for controlling the potential barrier of the transfer channel and the unwanted charges discharge channel with the transfer control element and the unwanted charges discharge control element during an arbitrary period within one screen period, so as to discharge the photo-generated charges accumulated in the accumulation well through the unwanted charges discharge channel. The transfer procedure is carried out after the single accumulation procedure and the parallel accumulation procedure carried out in the same period as the reading procedure are repeated the number of times based on the number of lines per one screen and the timing within the one screen period in the initialization procedure.

According to the embodiment of the present invention, by discharging the photo-generated charges accumulated in the accumulation well in an arbitrary period within one screen period, accumulation of the photo-generated charges in the accumulation well is initiated from the completion timing of this arbitrary period. Accumulation of the photo-generated charges is completed upon the photo-generated charges accumulated in the accumulation well being transferred to the modulation well through the transfer channel. Thus, corresponding to the timing of the discharging the photo-generated charges through the unwanted charges discharge channel, the accumulating period can be set without restraint, and imaging not only in the normal mode but in the high-speed shutter mode and in the low-speed shutter mode can be attained.

Moreover, a high-speed shutter mode where the period from the initialization procedure to the transfer procedure is shorter than one screen period is included.

According to the embodiment of the present invention, the accumulating period can be shortened, and even if an extremely bright light enters, an entire picture can be prevented from becoming whitish (washed out) and degrading the contrast thereof.

Moreover, a low-speed shutter mode where the period from the initialization procedure to the transfer procedure is longer than one screen period is included.

According to the embodiment of the present invention, the accumulating period can be increased, and even if incident light is extremely dark, a picture with sufficient brightness can be obtained.

BRIEF DESCRIPTION OF THE DRAWINGS

FIGS. 7A–E are diagrams showing the potential relationship for the same period of each section.

DETAILED DESCRIPTION

Figure 1:
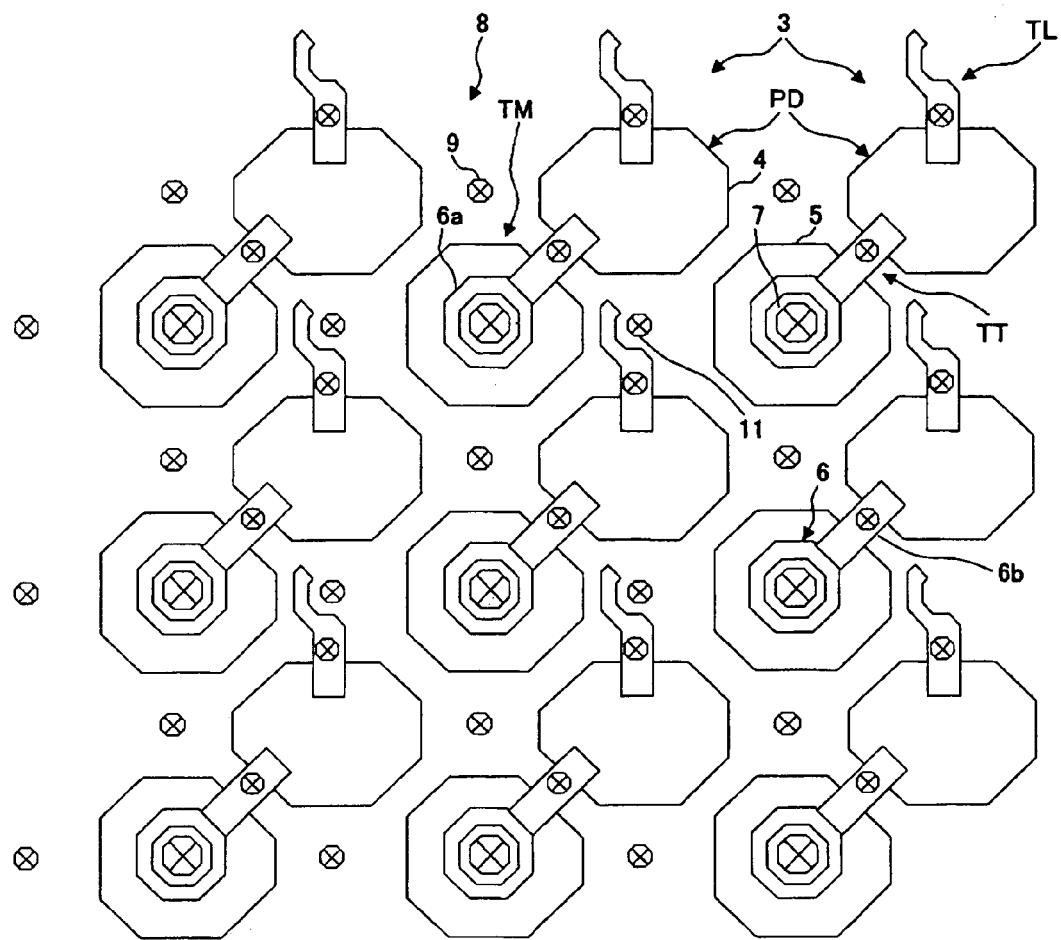
FIG. 1 is a plan view showing the planar shape of a solid state imaging device of a first embodiment of the present invention.
Figure 2:
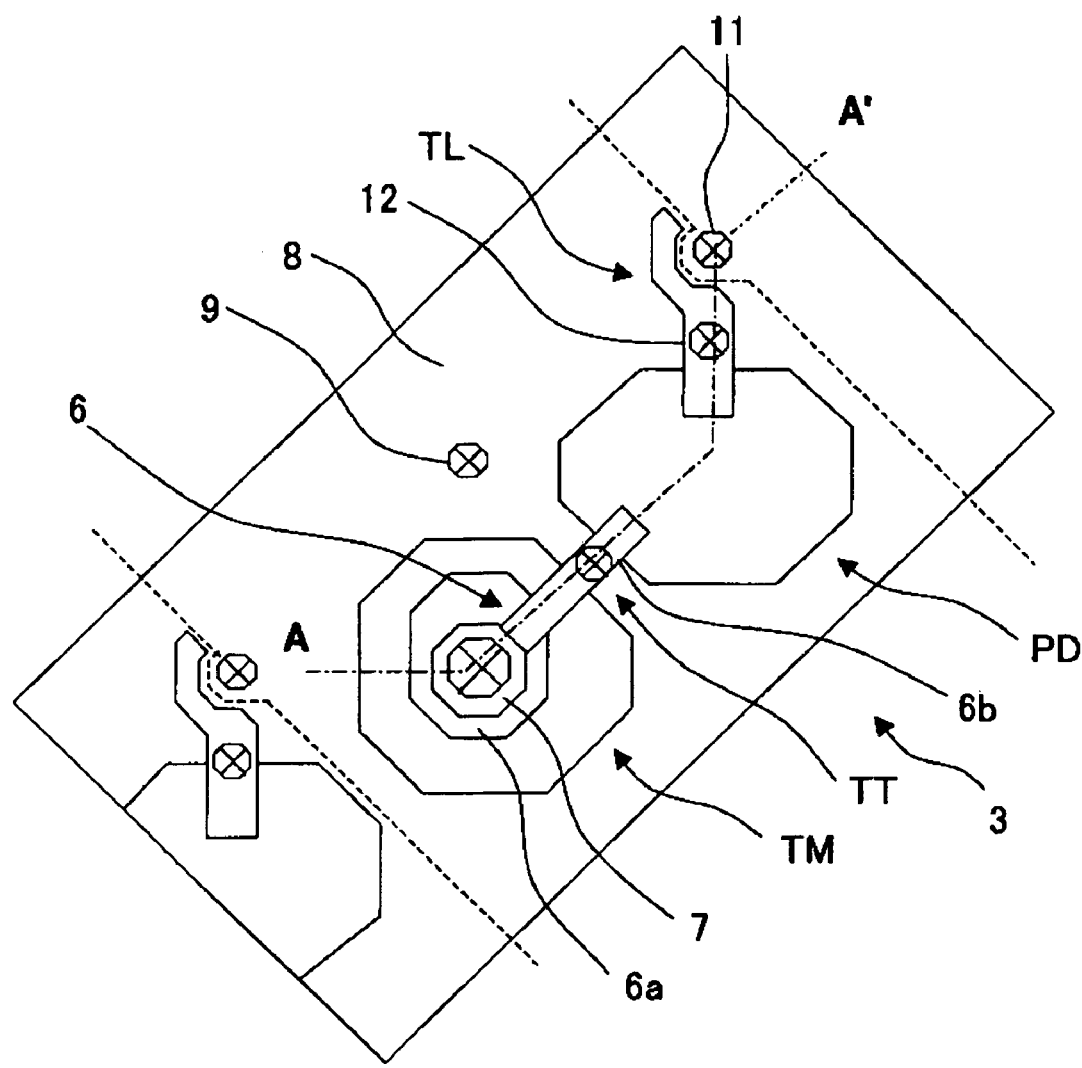
FIG. 2 is a plan view showing the planar shape of one cell of FIG. 1.
Figure 3:
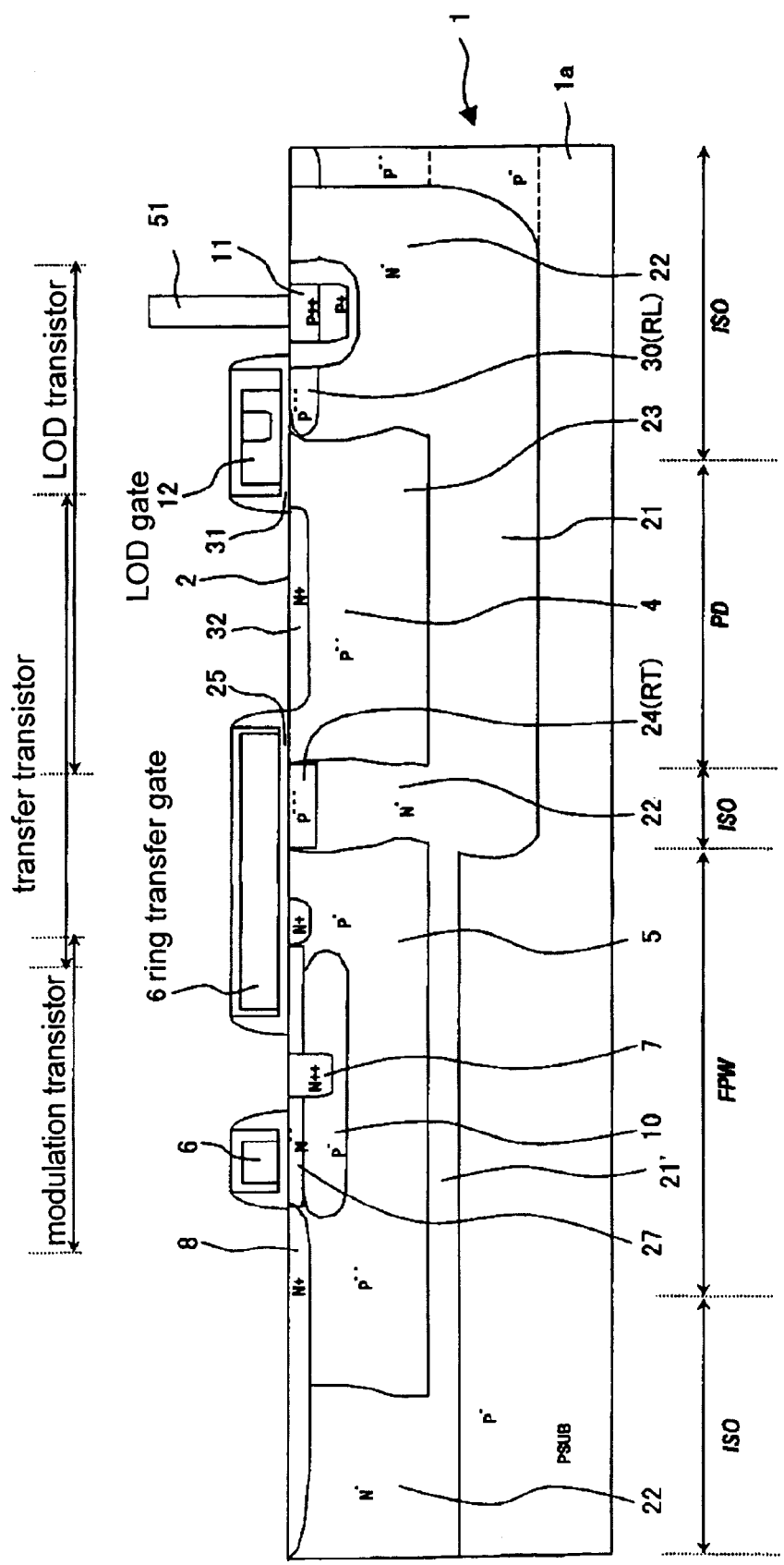
FIG. 3 is a sectional view showing the section cut along the A–A' line of FIG. 2.
Figure 4:
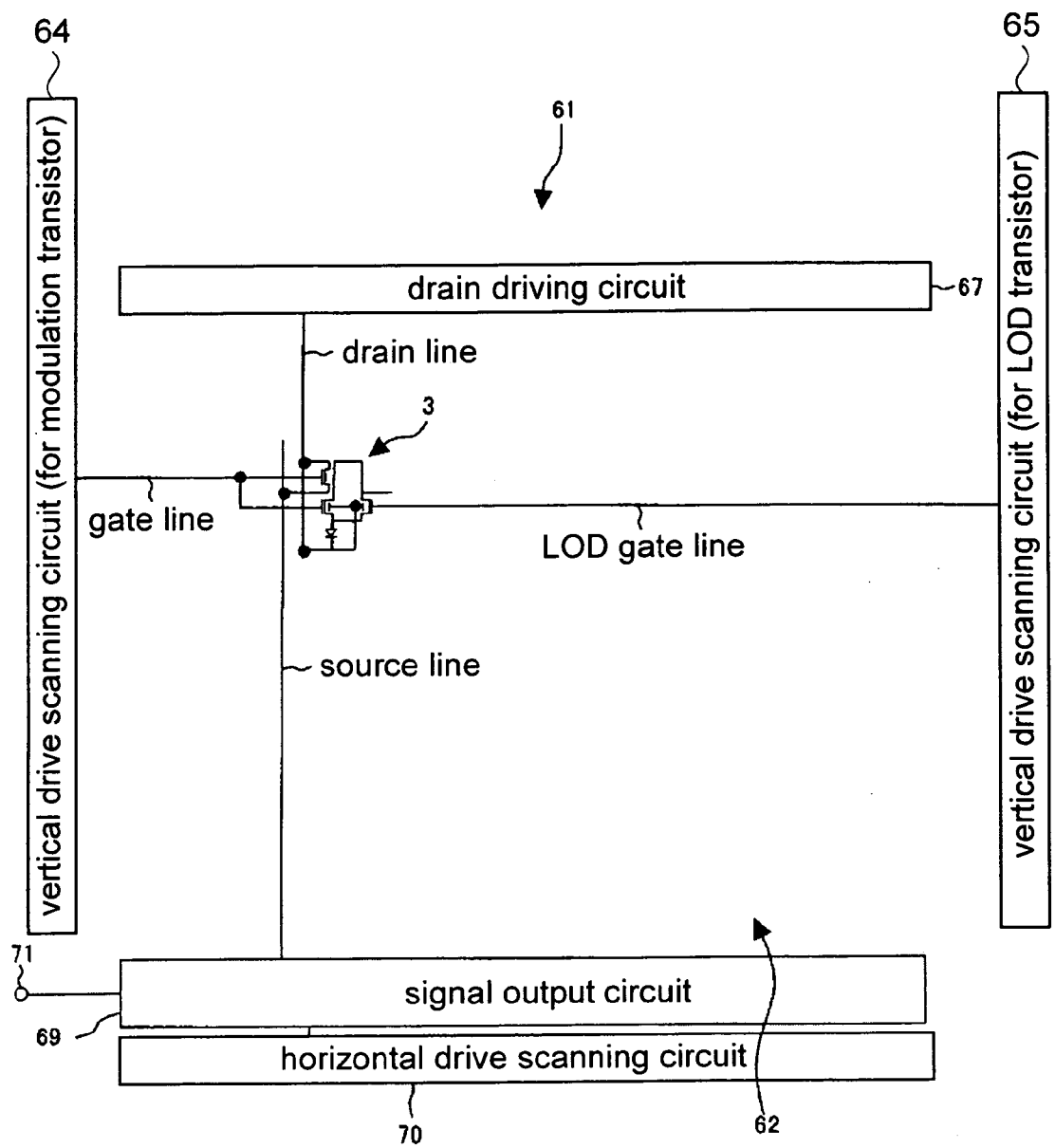
FIG. 4 is a block diagram showing the whole structure of the element.
Figures 7A, 7B, 7C, 7D, 7E:
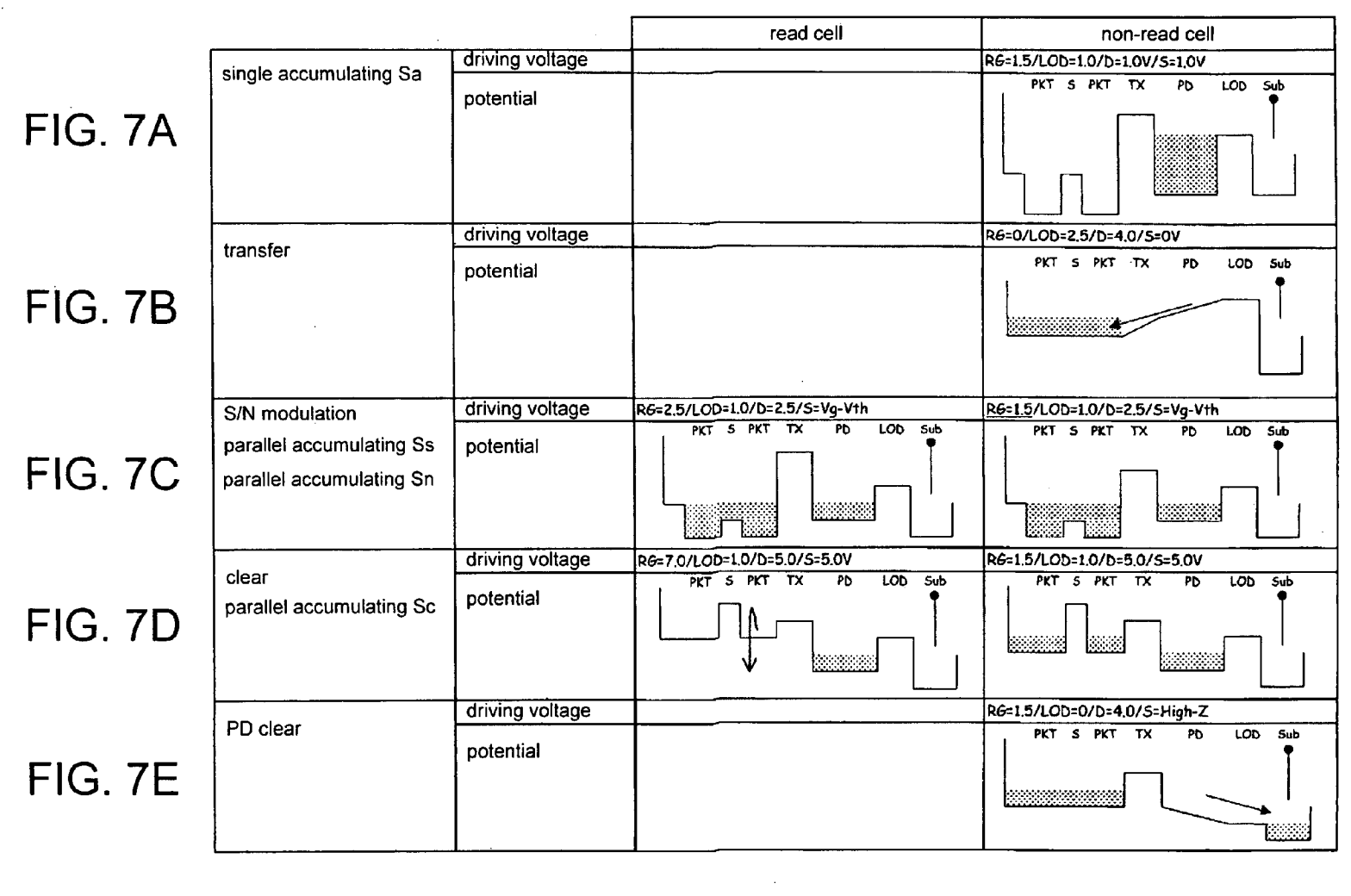
Figure 8:
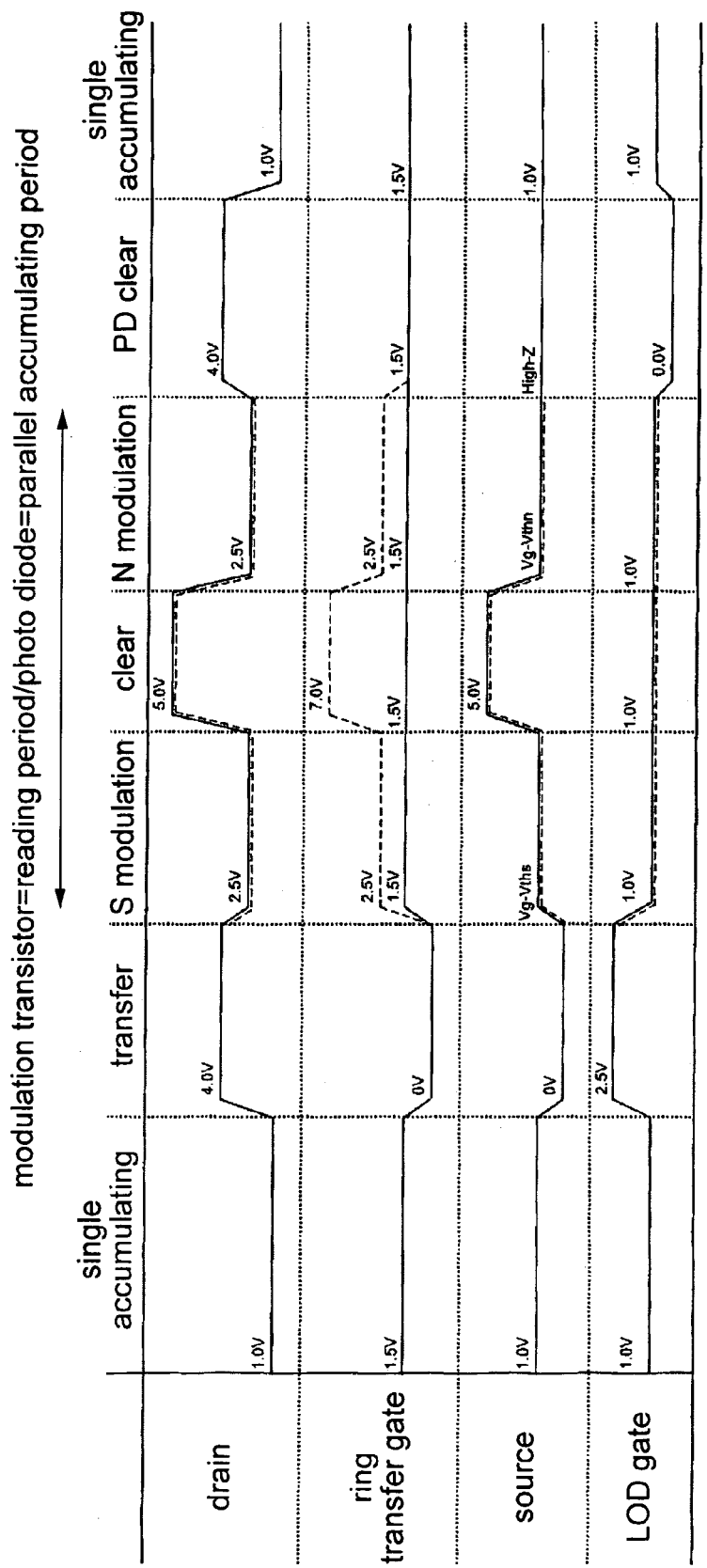
FIG. 8 is a diagram showing changes of the driving voltage in each period in the driving sequence.
Figure 9:
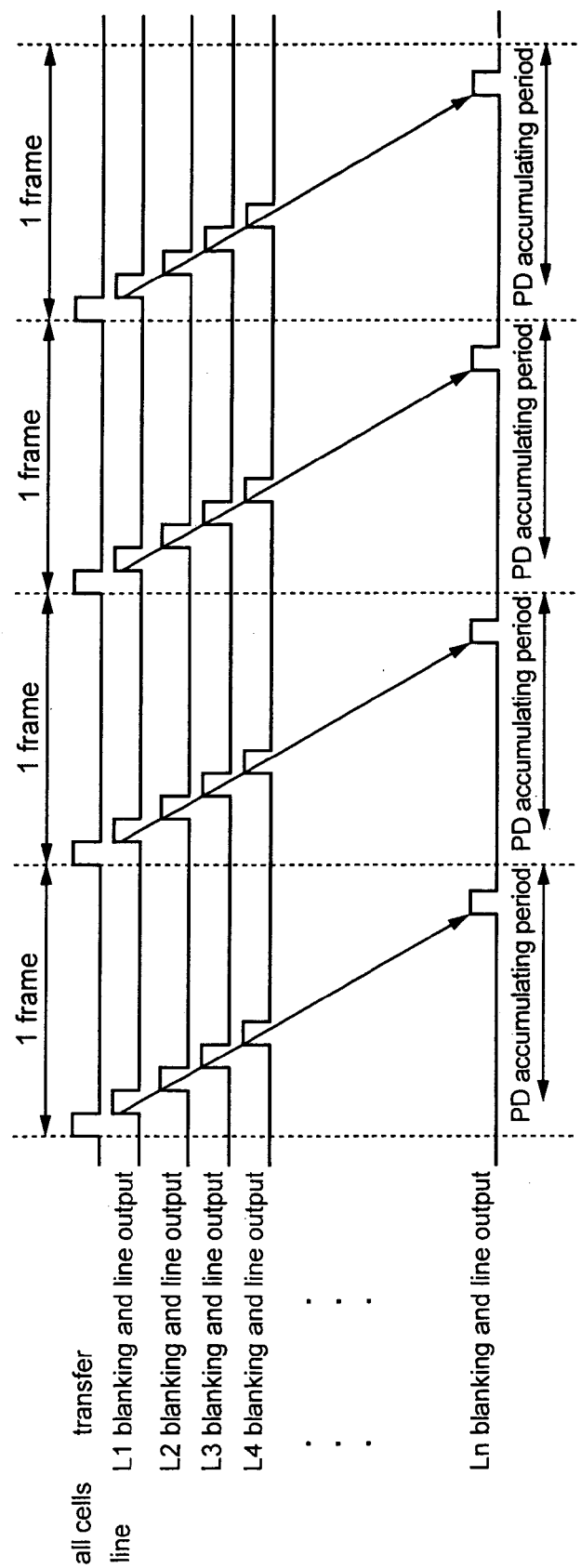
FIG. 9 is a timing chart showing a driving sequence.

In the following, embodiments of the present invention will be described in detail with reference to the accompanying drawings. FIG. 1 through FIG. 10 are related to a first embodiment of the present invention, and FIG. 1 is a plan view showing a planar shape of a solid state imaging device of the embodiment, FIG. 2 is a plan view showing a planar shape of one cell of FIG. 1, and FIG. 3 is a sectional view showing a section cut along the A–A' line of FIG. 2. FIG. 4 is a block diagram showing the whole structure of the element, and FIG. 5 is an equivalent circuit diagram of a sensor cell. FIG. 6 is a timing chart for illustrating the outline of each driving period in the embodiment. FIG. 7 is a diagram showing potential relationship for the same period of each section, and FIG. 8 is a diagram showing changes of the driving voltage for each period in the driving sequence. FIG. 9 and FIG. 10 are timing charts showing driving sequences.

The solid state imaging device of the present embodiment includes a photoelectric conversion element, an accumulation well, a modulation well, and a modulation transistor. In the present embodiment, the photoelectric conversion element is a photo-diode. The accumulation well is provided in a photoelectric conversion element formation region, and accumulates charges (hereinafter, referred to as photo-generated charges) generated by the photoelectric conversion element. The modulation well is provided in the modulation transistor formation region, and holds the photo-generated charges transferred from the accumulation well. The threshold of the modulation transistor is modulated by the photo-generated charges held in the modulation well, based on which the modulation transistor outputs the pixel signal.

Moreover, the solid state imaging device of the present embodiment includes a photo-generated charge transfer channel and a transfer control element. The photo-generated charge transfer channel is provided between the accumulation well and the modulation well. The photo-generated charges are transferred from the accumulation well to the modulation well through the photo-generated charge transfer channel. The transfer control element controls the potential barrier of the photo-generated charge transfer channel, and moves photo-generated charges to the modulation well from the accumulation well. In the present embodiment, the transfer control element is a transfer transistor. The accumulation well and the modulation well are independently separated in terms of potential by the transfer control element. Accordingly, the accumulating period and the reading period (hereinafter, referred to as a blanking period) can be set within the same period, and consequently the frame rate can be increased.

The solid state imaging device includes a residual charges discharge channel, a contact region for discharging residual charges, and a residual charges discharge control element. The residual charges discharge channel is provided between the modulation well and the contact region for discharging residual charges, and is provided almost parallel to a substrate surface. The residual charges discharge channel is electrically coupled to the wiring layer provided on a surface with the contact region for discharging residual charges therebetween. Charges remaining in the modulation well (it is referred to as residual charge hereinafter) pass through the residual charges discharge channel so as to be transferred from the modulation well to the contact region for discharging residual charges. The contact region for discharging residual charges is formed inside the residual charges discharge channel. The residual charges discharge control element controls the potential barrier of the residual charges discharge channel so as to discharge residual charges from the modulation well to the wiring layer. In the present embodiment, the residual charges discharge control element is a clear transistor. Residual charges are not discharged vertically downward in a substrate directly. That is, residual charges are moved almost parallel to the substrate surface, namely in a substrate lateral direction, thereafter being discharged toward the wiring layer formed on a substrate. This enables the versatility in design of potential to be enhanced in a modulation transistor formation region.

Furthermore, the solid state imaging device of the present embodiment includes an unwanted charges discharge channel, a contact region for discharging unwanted charges, and an unwanted charges discharge control element. The unwanted charges discharge channel is provided between the accumulation well and the contact region for discharging unwanted charges, and provided almost parallel to the substrate surface. The unwanted charges discharge channel is electrically coupled to a wiring layer provided on the substrate with the contact region for discharging unwanted charges therebetween. Unnecessary charges (hereinafter, referred to as unwanted charges) that overflow from the accumulation well without being accumulated in the accumulation well and do not contribute to the picture signal, are transferred to the contact region for discharging unwanted charges from the accumulation well through the unwanted charges discharge channel. The contact region for discharging unwanted charges is formed inside the unwanted charges discharge channel. The unwanted charges discharge control element controls the potential barrier of the unwanted charges discharge channel so as to discharge unwanted charges from the accumulation well to the wiring layer. In the present embodiment, the unwanted charges discharge control element is a lateral-overflow-drain (hereinafter, referred to as LOD) transistor. Unwanted charges are not directly discharged perpendicularly downward in the substrate from either one of the accumulation well and the contact region for discharging unwanted charges. That is, unwanted charges are displaced almost parallel to the substrate surface, namely in the substrate lateral direction, and are discharged then to the wiring layer formed on the substrate. Accordingly, miniaturization can be attained, even if the depth of the impurity layer in the photoelectric conversion element formation region is deepened to attain higher quality picture.

Moreover, in the present embodiment, the gate of the modulation transistor TM is integrated with that of the transfer transistor TT. This enables the number of wiring coupled to the gates of the transistors TM and TT to be reduced, and enables a drive circuit for driving the transistors TM and TT to be omitted. According to this, great advantages are achieved from a point of view of cell layout.

Structure of Sensor Cell

The solid state imaging device according to the present embodiment has a sensor cell array constituted by arranging sensor cells, which are unit pixels, in a matrix form, as will be described later. Each sensor cell accumulates photo-generated charges generated corresponding to incident light, and outputs the pixel signal with a level based on the accumulated photo-generated charges. The picture signal of one screen is obtained by arranging the sensor cells in a matrix form.

First, the structure of each sensor cell will be described with reference to FIG. 1 through FIG. 3. FIG. 1 shows a sensor cell with 3 horizontal pixels ×3 perpendicular pixels, and FIG. 2 shows one sensor cell. In addition, one sensor cell is within a region shown with the dashed lines of FIG. 2. In addition, the present embodiment shows an example using holes as photo-generated charges. In the case of using electrons as photo-generated charges, the same can be constructed. Moreover, FIG. 3 shows a sectional structure of the cell cut along the A–A' line of FIG. 2.

As shown in the plan views of FIG. 1 and FIG. 2, the photo-diode PD and the modulation transistor TM are adjacently formed in a sensor cell 3 which is a unit pixel. As for the modulation transistor TM, an N-channel depletion MOS transistor is used, for example. The unit pixel has an almost rectangular shape, each side of which is inclined to the column or row direction of the sensor cell array.

In the photo-diode PD formation region (PD of FIG. 3), an opening region 2 is formed on the surface of the substrate 1, and an accumulation well 4 which is a P-type well with a region wider than the opening region 2 is formed in the relatively shallow position of the substrate 1 surface. The modulation well 5 which is a P-type well is formed in a modulation transistor TM formation region (FPW of FIG. 3) with a predetermined space apart from this accumulation well 4.

Above the modulation well 5, a ring-shaped portion (it is referred to as a ring gate portion hereinafter) 6a of a gate (ring transfer gate) 6 whose one terminal side is a ring-shape and the other terminal side is a line-shape, is formed in the substrate 1 surface, and a source region 7 which is a high concentration N-type region is formed in the region near the substrate 1 surface of the center opening portion of the ring gate portion 6a. An N-type drain region 8 is formed in the surroundings of the ring gate portion 6a. A drain contact region 9 of an N+ layer is formed in a predetermined position of the drain region 8 near the substrate 1 surface.

The modulation well 5 controls the threshold voltage of the channel of the modulation transistor TM. In the modulation well 5, a carrier pocket 10 (FIG. 3) which is a P-type high concentration region under the ring gate portion 6a is formed. The modulation transistor TM is made up of the modulation well 5, the ring gate portion 6a, the source region 7, and the drain region 8, and the threshold voltage of the channel thereof changes corresponding to the charges accumulated in the modulation well 5 (carrier pocket 10).

A depletion region (not shown) is formed in the boundary region of an N type well 21, which will be described later, and the P-type accumulation well 4 which are formed on the substrate 1 under the opening region 2 of the photo diode PD, and photo-generated charges generated by light incident through the opening region 2 are generated in this depletion region. In the present embodiment, the photo-generated charges that have been generated are accumulated in the accumulation well 4.

The charges accumulated in the accumulation well 4 are transferred to the modulation well 5, and are held in the carrier pocket 10. Accordingly, the source potential of the modulation transistor TM becomes the one corresponding to the amount of the charges transferred to the modulation well 5, i.e., to the light incident upon the photo diode PD.

A contact region 11 for discharging unwanted charges (hereinafter, referred to as an OD contact region), including overflow charges that overflow, is formed by a high concentration P-type diffusion layer in the substrate 1 surface near the accumulation well 4. On the substrate 1 surface between this OD contact region 11 and the accumulation well 4 region, an LOD gate 12 of an LOD transistor TL for forming a channel RL for the unwanted charges (hereinafter, referred to as unwanted charges discharge channel) including the charges that overflow between the OD contact region 11 and the accumulation well 4 region is formed. In addition, one end of the LOD gate two-dimensionally hangs over the accumulation well 4 region.

In the present embodiment, the transfer transistor TT is formed between the accumulation well 4 and the modulation well 5. The gate of the transfer transistor TT is made up of a linear portion (it is referred to as a transfer gate portion hereinafter) 6b of the ring transfer gate 6. The transfer gate portion 6b is formed on the substrate 1 surface of the channel RT between the accumulation well 4 and the modulation well 5 (hereinafter, simply referred to the transfer channel). The charges transfer from the accumulation well 4 to the modulation well 5 can be controlled by controlling the potential barrier of the transfer channel RT with the transfer transistor TT.

As described, in the present embodiment, the ring gate portion 6a and the transfer gate portion 6b, that constitute the modulation transistor TM and the transfer transistor TT, respectively, are formed integrally with each other. By applying drive voltage to the ring transfer gate 6, the modulation transistor TM and the transfer transistor TT are controlled simultaneously.

Section of Sensor Cell

Furthermore, with reference to FIG. 3, the cross-sectional structure of the sensor cell 3 will be described in detail. Incidentally, the subscripts, "−" and "+", of N and P in FIG. 3 indicate the state of a portion, depending on the number of the subscript, from lighter impurity concentration (subscript −−−) to heavier impurity concentration (subscript +++).

FIG. 3 shows the modulation transistor TM formation region (FPW) and the photo-diode PD formation region (PD) for approximately one unit pixel (cell). An isolation region (ISO) is provided between the photo-diode PD formation region and the modulation transistor TM formation region in a cell and between adjoining cells.

On a P-type substrate 1a of the photo-diode PD formation region, the N-type well 21 of $N^-$ is formed at a deep position of the substrate. Meanwhile, on the P-type substrate 1a of the modulation transistor TM formation region, an N-type well 21' of $N^-$ is formed at a relatively shallow position of the substrate. An isolation region 22 for isolating elements is formed by an $N^-$ layer on these N-type wells 21 and 21'. On the N-type well 21, a $P^{--}$ layer 23 is formed across all the elements except for the isolation region 22.

The $P^{--}$ layer 23 in the photo-diode PD formation region functions as the accumulation well 4. The $P^{--}$ layer 23 in the modulation transistor TM formation region functions as the modulation well 5, and in this modulation well 5, the carrier pocket 10 is formed by $P^-$ diffusion.

The transfer transistor TT is formed on the substrate surface side in the isolation region 22 between the photo-diode PD formation region, and the modulation transistor TM formation region in the cell. The transfer transistor TT is constituted by forming a $P^{---}$ diffusion layer 24 which constitutes a channel on the substrate surface, and the transfer gate portion 6b above the substrate surface with a gate insulating layer 25 therebetween. This $P^{---}$ diffusion layer 24, being coupled to the accumulation well 4 and the modulation well 5, constitutes the transfer channel RT, and the potential barrier of this transfer channel RT is controlled corresponding to the applied voltage to the transfer gate portion 6b.

In the modulation transistor TM formation region, the ring gate portion 6a is formed in the substrate surface with a gate insulation film 25 therebetween, and $N^{--}$ diffusion layer 27 which constitutes a channel is formed in the substrate surface under the ring gate portion 6a. An $N^{++}$ diffusion layer is formed in the substrate surface of the center of the ring gate portion 6a so as to constitute the source region 7. Moreover, an $N^+$ diffusion layer is formed in the substrate surface in the periphery of the ring gate portion 6a so as to constitute the drain region 8. The $N^{--}$ diffusion layer 27 which constitutes a channel is coupled to the source region 7 and the drain region 8.

An OD contact region 11 is formed, on the substrate surface side, in the isolation region 22 between the photo-diode PD formation region and the modulation transistor TM formation region of adjoining cells. The OD contact region 11 is obtained by forming a $P^{++}$ diffusion layer in the substrate surface.

The LOD transistor TL is formed on the substrate surface side between the photo-diode PD formation region and the OD contact region 11. The LOD transistor TL is constituted by forming $P^{---}$ diffusion layer 30 which constitutes a channel in the substrate surface between the photo-diode PD formation region and the OD contact region 11, and forming the LOD gate 12 above the substrate surface with the gate insulating layer 31 therebetween. This $P^{---}$ diffusion layer 30, being coupled to the accumulation well 4 and the OD contact region 11, constitutes the unwanted charges discharge channel RL, and the potential barrier of this unwanted charges discharge channel RL is controlled corresponding to the applied voltage to the LOD gate 12.

In addition, an N⁺ diffusion layer 32 is formed on the substrate surface side of the photo-diode PD formation region.

A wiring layer (not shown) is formed above the substrate surface with an interlayer insulation layer (not shown) therebetween. The LOD gate 12, the ring transfer gate portion 6, the OD contact region 11, the source region 7, and the drain contact region 9 are electrically coupled to each wiring of the wiring layer by contact holes opened in the interlayer insulation film. FIG. 3 shows that the OD contact region 11 is coupled to the wiring 51. In addition, each wiring is made of metal material, such as aluminum.

In the present embodiment, the potential barriers of the transfer channel RT and the unwanted charges discharge channel RL are controlled by independently controlling the transfer transistor TT and the LOD transistor TL. When describing the ups and downs (rising and lowering) of the potential of these channels, RT and RL, with reference to the hole potential, in the accumulating period, the potentials of the transfer channel RT and the unwanted charges discharge channel RL are set high enough to allow photo-generated charges (in the case of hole) to be accumulated, while the potential of the unwanted charges discharge channel RL is set lower than the potential of the transfer channel RT. In addition, hereinafter, the ups and downs of the potential will be described with reference to the hole potential, not to the electron potential.

Operation

The accumulating period and the blanking period can be carried out in the same time period by using the sensor cell constituted this way.

Comparison with Conventional Example

In the device of the above mentioned Japanese Unexamined Patent Publication No. 2002-134729, under the photo-diode formation region and the ring gate of the modulation transistor, a first and a second P-type well region are integrally formed in a planar shape which approximately equals the opening region of the photo diode and the ring gate. Then, photo-generated charges generated by light incident from the opening region of the photo-diode are transferred from the first well region to the second well region under the ring gate, and are accumulated in the carrier pocket with a low potential (with reference to the hole potential) formed in this portion.

In such a device of Japanese Unexamined Patent Publication No. 2002-134729, the accumulation and the reading can also be carried out with shifting, within one frame period, the line to be initialized using a focal-plane shutter. However, in this case, each cell has a different timing for the accumulating period for each line, and the sampling timing of a picture will deviate in the vertical direction. Therefore, if an object to be imaged moves, picture distortion arises due to the sampling timing offset in the vertical direction of the picture. Especially, where there are many lines provided because of high resolution requirement, the time deviation will increase between upper and lower lines and the distortion will be outstanding.

Thus, in Japanese Unexamined Patent Publication No. 2002-134729, the accumulating period of all the cells is set to a common period. Namely, during the accumulating period, the potential barrier between the first well region and the second well region integrally formed is lowered by the transfer gate. According to this, the photo-generated charges are transferred from the first well region to the second well region, and continue to be accumulated in the carrier pocket. Upon completion of the accumulating period, the pixel signal corresponding to the charges in the carrier pocket will be outputted in the reading period. In the device of Japanese Unexamined Patent Publication No. 2002-134729, in this reading period, the photo-generated charges generated in the light-receiving region are discharged to the substrate through the overflow-drain region, thereby enabling the accumulation of only effective photo-generated charges in the accumulating period.

On the other hand, in the present embodiment, the accumulating period and the reading period are set to be within a common period. Namely, during the accumulating period, the potential barriers of the transfer channel RT and the unwanted charges discharge channel RL are set to a potential high enough by independently controlling the transfer transistor TT and the LOD transistor TL. Moreover, the potential of the unwanted charges discharge channel RL is set lower than the potential of the transfer channel RT during the period other than the transfer period, which will be described later, for example, during the accumulating period. Accordingly, in the accumulating period, the transfer of the charges between the modulation well 5 and the accumulation well 4 can be prevented, and the photo-generated charges can be accumulated in the accumulation well 4.

Thus, during the period before the reading based on the photo-generated charges which are transferred to the modulation well 5 and held is completed, the amount of the photo-generated charges being held can be made constant even within the accumulating period. Therefore, even in the accumulating period, the reading of the pixel signal based on the charges held in the modulation well 5 can be carried out.

Moreover, during the accumulating period, the accumulation well 4 is surrounded, in terms of potential, by the transfer transistor TT and the LOD transistor TL having a sufficiently high potential barrier, the accumulation can be carried out even in the reading period of the modulation well 5. Furthermore, even when the potential based on the photo-generated charges increases remarkably such as when an extremely strong light enters, the photo-generated charges flow to the OD contact region 11 side, not to the modulation well 5 side, and will not have an adverse influence on the reading.

Moreover, in the device of Japanese Unexamined Patent Publication No. 2002-134729, neither a higher quality picture nor miniaturization have been achieved satisfactorily due to the fact that the overflow-drain region used as a discharge channel on the first well region side needs to be constituted with a deep P-layer extending from the substrate to the substrate surface.

On the other hand, in the present embodiment, unwanted charges including the charges that overflow from the accumulation well 4 are transferred in the horizontal direction, and thereafter are discharged from the OD contact region 11 through the wiring 51 on the substrate 1. Therefore, it is not necessary to form a deep over-drain region extending from the substrate 1a to the substrate 1 surface, and both a higher quality picture and miniaturization can be achieved satisfactorily.

Circuit Configuration of Whole Device

Next, the circuit configuration of the whole solid state imaging device according to the present embodiment will be described with reference to FIG. 4.

A solid state imaging device 61 has a sensor cell array 62 including the sensor cell 3 of FIG. 1 through FIG. 3, and circuits 64, 65, 67 through 70 which drive each sensor cell 3 in the sensor cell array 62. The sensor cell array 62 is constituted by arranging the cell 3 in a matrix form. The sensor cell array 62 includes, for example, the cell 3 of 640×480, and a region (OB region) for the optical black (OB). When the OB region is included, the sensor cell array 62 is made up of the cells 3 of 712×500 or the like.

Equivalent Circuit of Sensor Cell

Figure 5A:
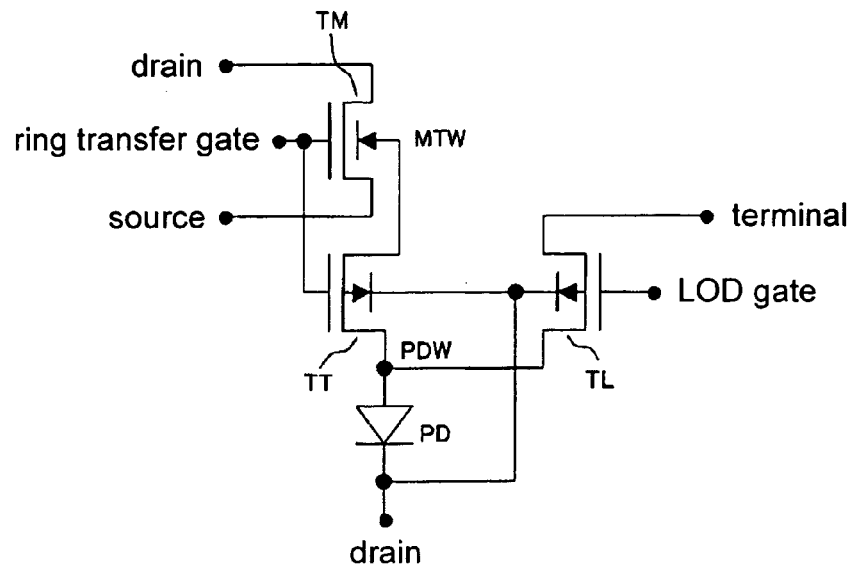
FIGS. 5A–B are equivalent circuit diagrams of a sensor cell.
Figure 5B:
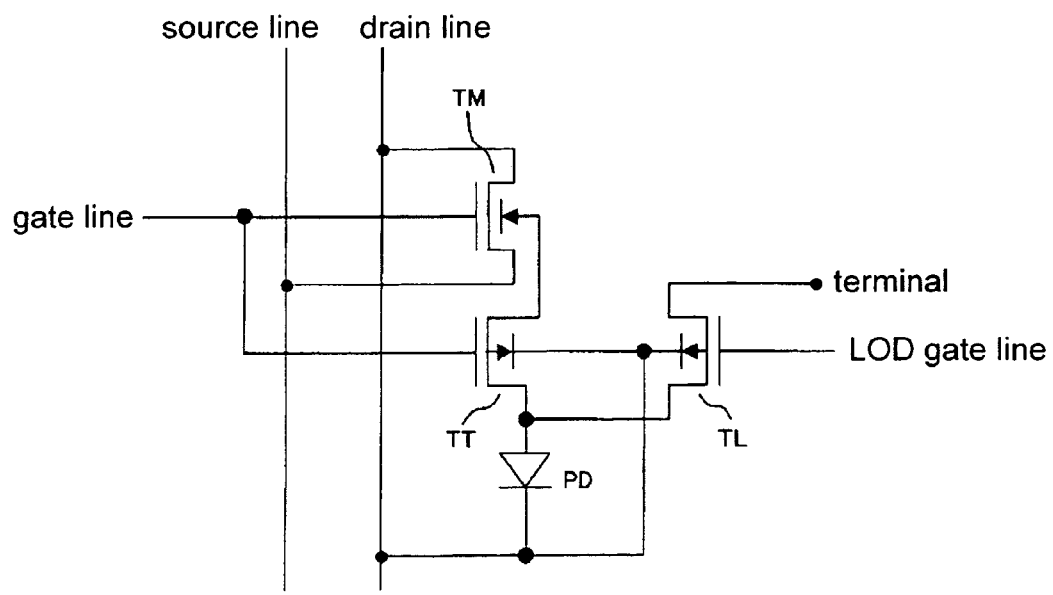
Figure 6:
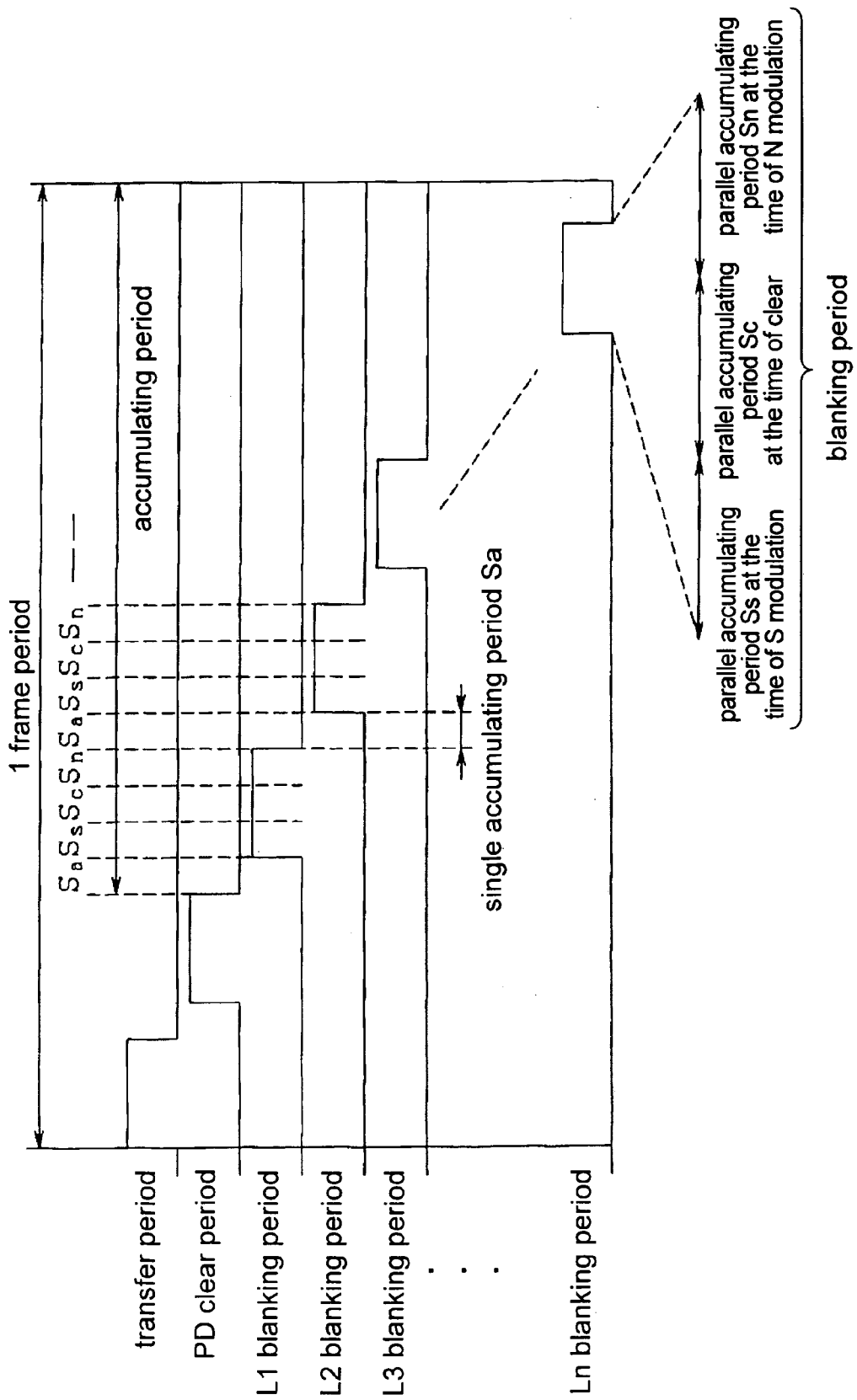
FIG. 6 is a timing chart illustrating the outline of each driving period in the first embodiment.

FIG. 5 shows the specific circuit configuration of each sensor cell in FIG. 4. FIG. 5(A) shows an equivalent circuit of the sensor cell, and FIG. 5(B) shows coupling between the sensor cell and each signal line.

Each sensor cell 3 includes the photo-diode PD which performs photoelectric conversion, the modulation transistor TM for detecting and reading the optical signal, and the transfer transistor TT which controls transfer of photo-generated charges. The photo diode PD generates the charges (photo-generated charges) corresponding to incident light, and accumulates the generated charges in the accumulation well 4 (corresponding to a coupling point PDW in FIG. 5). The transfer transistor TT transfers the photo-generated charges accumulated in the accumulation well 4 in the accumulating period to the carrier pocket 10 in the modulation well 5 (corresponding to a coupling point TMW in FIG. 5) used for the threshold modulation of the modulation transistor TM in the transfer period, and make them to be held.

With respect to the modulation transistor TM, that the photo-generated charges are held in the carrier pocket 10 is equivalent to that the back gate bias thereof is changed, and the threshold voltage of the channel changes corresponding to the amount of the charges in the carrier pocket 10. Accordingly, the source voltage of the modulation transistor TM becomes the one corresponding to the charges in the carrier pocket 10, i.e., the brightness of the light incident upon the photo diode PD.

Between the accumulation well 4 and the terminal, the LOD transistor TL as the unwanted charges discharge control element is arranged. The LOD transistor TL controls the potential barrier between the accumulation well 4 and the terminal, and discharges the unwanted charges in the accumulation well 4 to the terminal.

Thus, each cell 3 exhibits the above mentioned operations of the accumulation, the transfer, the reading, the discharge, or the like by applying a driving signal to the ring gate portion 6a of the modulation transistor TM, the source and the drain, the transfer gate portion 6b of the transfer transistor TT, and the LOD gate 12 of the LOD transistor TL. The ring gate portion 6a of the modulation transistor TM and the transfer gate portion 6b of the transfer transistor TT are formed integrally with each other as the ring transfer gate 6. As shown in FIG. 4, a signal is provided to each part of the cell 3 from vertical drive scanning circuits 64 and 65, a drain driving circuit 67.

FIG. 5(B) shows the coupling to each of the scanning circuits 64 and 65, the driving circuits 67, and the signal output circuit 69, for one of the cells 3 arranged in a matrix form. The coupling condition of other cells is the same. Each cell 3 is provided corresponding to the intersection of a plurality of source lines horizontally arranged and a plurality of gate lines vertically arranged with respect to the sensor cell array 62. In each cell 3 of each line arranged in the horizontal direction, the ring transfer gate 6 of the modulation transistor TM is coupled to a common gate line, and in each cell 3 of each column arranged in the vertical direction, the source of the modulation transistor TM is coupled to a common source line.

By providing an ON signal to one of the plurality of gate lines, each cell commonly coupled to the gate line to which the ON signal is provided is simultaneously selected, and the pixel signal is outputted through each source line from each source of these selected cells. The vertical drive scanning circuit 64 provides ON signals to the gate lines by sequentially shifting in one frame period. The pixel signals from each cell of the line to which the ON signal is provided are simultaneously read from the source lines by one line portion, and are provided to the signal output circuit 69. The pixel signals for one line portion are sequentially outputted (line-out) for every pixel from the signal output circuit 69 by the horizontal drive scanning circuit 70.

In the present embodiment, as described above, the accumulation well 4 and the modulation well 5 are formed, with being independently separated in terms of the potential, and the transfer transistor TT which controls the potential barrier between the accumulation well 4 and the modulation well 5 is provided. Thus, accumulation of the photo-generated charges by the photo diode PD and the reading of the pixel signal by the modulation transistor TM are carried out simultaneously. Control of the transfer transistor TT is carried out by providing a gate signal to the ring transfer gate 6 of each transfer transistor TT from the vertical drive scanning circuit 64.

Moreover, in the present embodiment, as described above, by providing the LOD transistor TL which controls the potential barrier of the unwanted charges discharge channel RL of the accumulation well 4, the discharge of the unwanted charges from the accumulation well 4 can be securely carried out in terms of the potential. Control of the LOD transistor TL is carried out by providing the gate signal to each LOD gate 12 from the vertical drive scanning circuit 65. In addition, the drain driving circuit 67 provides a drain voltage to the drain of each modulation transistor TM.

In the present embodiment, the modulation transistor TT and the transfer transistor TM are controlled with a gate signal that is supplied thereto from the vertical drive scanning circuit 64 via the ring transfer gate 6 formed integrally. Namely, in order to control the modulation transistor TT and the transfer transistor TM, it is sufficient to provide a common drive circuit and common gate line (wiring for contact), which is greatly advantageous from a cell layout point of view.

Relationship between accumulating period and reading period

FIG. 6 is a timing chart for illustrating each driving period in the present embodiment. In addition, FIG. 6 shows the driving sequence in the normal mode to be described later. In FIG. 6, L1, L2 and so on correspond to each line of the sensor cell array 62.

The accumulating period is set to be within a period common to all the cells, as will be described later. However, the reading is carried out for each line. The reading timing differs for each line, and the reading period (blanking period) for each line is shown as a pulse shape in FIG. 6. Hereinafter, the line where the reading is carried out is referred to as a read line, and each cell of the read line is referred to as the read cell. Moreover, lines other than the read line are referred to as non-read lines, and each cell for non-read lines is called a non-read cell.

Reading Period

The reading period (blanking period) comprises an S (signal) modulation period, a clear period, and an N (noise) modulation period in the present embodiment. A signal component and a noise component are read from the same cell to be compared in order to remove the variation between the cells 3 and various kinds of noises. During the S modulation period, an S modulation operation for reading the pixel signal based on the photo-generated charges accumulated in the modulation well 5 is carried out. During the clear period, a clear operation for discharging the photo-generated charges remaining in the modulation well 5 through the residual charges discharging channel RC is carried out in order to read the noise component. During the N modulation period, in order to read the noise component from the modulation well 5, N modulation operation which reads the pixel signal after the clear is carried out.

Accumulating Period

In the present embodiment, the accumulation operation (parallel accumulation operation) for the accumulation well 4 is carried out even in the blanking period. Namely, the S modulation period, the clear period, and the N modulation period during the blanking period each are, in terms of the accumulation, a parallel accumulating period Ss at the time of the S modulation, the parallel accumulating period Sc at the time of the clear, and a parallel accumulating period Sn at the time of the N modulation.

The accumulating period according to the present embodiment includes, besides a parallel accumulating period which is the same period as the blanking period, a single accumulating period Sa where a single accumulation operation is carried out. The pixel signal read in the blanking period is held in a line memory (corresponding to the signal output circuit 69 of FIG. 4). The pixel signals for one line portion are sequentially outputted per pixel from this line memory, and the reading from each cell of the following line is carried out after the output of the line memory is completed. Therefore, the reading from the cell of the following line cannot be carried out until the output from the line memory is completed, and thus the single accumulating period Sa is set within a period required to transfer and output (line-out) the pixel signal from such a line memory.

Sequence in Frame

In the present embodiment, for example, as shown in FIG. 6, one frame period is constituted by cyclically repeating the single accumulating period Sa and the parallel accumulating periods Ss, Sc, and Sn, after the transfer period and the PD clear period to be described later. All the cells 3 of the sensor cell array 62 cyclically repeat operation of the single accumulating period Sa and the parallel accumulating periods Ss, Sc, and Sn. Then, only the period shown in the pulse shape of FIG. 6 among the parallel accumulating periods Ss, Sc, and Sn is set to be the blanking period for each line (as becoming the reading cell), and the reading operation is carried out. In one frame period, the single accumulating period Sa and the blanking period are repeated by the number of lines.

In the single accumulating period Sa and the parallel accumulating periods Ss, Sc, and Sn, the photo-generated charges are successively accumulated in the accumulation well 4, as will be described later. As shown in FIG. 6, the period from completion of the PD clear period to the completion of a frame period is the accumulating period, during which the photo-generated charges accumulated in the accumulation well 4 will be transferred from the accumulation well 4 to the modulation well 5 in the transfer period, which is the leading period of the following frame, shown in FIG. 6, and are held. During the transfer period, all the cells perform the transfer operation as will be described later.

Next, the PD clear period, which is very short, is set up in order to discharge the photo-generated charges generated during the period from the completion of the transfer period to the start of the accumulating period. In the PD clear period, unwanted charges are discharged from the accumulation well 4 of all the cells. In addition, the PD clear period is used for setting up the length of the accumulating period, and the PD clear period can be omitted in the normal mode.

Looking at a predetermined line, for example, in each cell in a line L1 as the read cell at the modulation transistor TM side, during the blanking period as shown in FIG. 6, the S modulation operation, the clear operation, and the N modulation operation are carried out. At the same time, at the accumulation well 4 side, the parallel accumulation operation Ss at the time of the S modulation, the parallel accumulation operation Sc at the time of the clear, and the parallel accumulation operation Sn at the time of the N modulation are carried out. During the period other than this blanking period, as for the non-read cell, the single accumulation operation Sa, the parallel accumulation operation Ss at the time of the S modulation, the parallel accumulation operation Sc at the time of the clear, and the parallel accumulation operation Sn at the time of the N modulation are cyclically repeated.

Namely, in any cell, all the periods except for the transfer period and the PD clear period are set as the single or the parallel accumulating period, and the parallel accumulation operation is also carried out especially during the blanking period of the read cell. Then, the accumulated photo-generated charges are transferred to the modulation well 5 in the transfer period at the beginning of the following frame. Namely, the period from the completion of PD clear period (the completion of the transfer period in the case that the PD clear period is omitted) of the preceding frame to the start of the transfer period is the accumulating period for each cell, and the pixel signal used for blanking is based on the photo-generated charges accumulated in the accumulating period of the preceding frame.

Potential

Next, with reference to FIG. 7 and FIG. 8, operation in the single accumulating period Sa, the transfer period, the S modulation period (parallel accumulating period Ss), the clear period (parallel accumulating period Sc), and the N modulation period (parallel accumulating period Sn) and PD clear period will be described based on the potential relationship. FIG. 7 is an explanatory diagram illustrating the potential relationship for each period with defining a direction along which the hole potential becomes higher as a positive side. FIG. 7(A) shows the condition at the time of the single accumulation, FIG. 7(B) shows the condition at the time of the transfer, FIG. 7(C) shows the condition at the time of the S modulation or the N modulation (S/N modulation), FIG. 7(D) shows the condition at the time of the clear and FIG. 7(E) shows the condition at the time of the clear (PD clear) of the accumulation well 4 in a high-speed shutter mode. The column on the left side of FIG. 7 shows the condition of the read cell, and the column of the right side shows the condition of the non-read cell. In addition, FIG. 7 shows the potential changes based on the charges, with a satin pattern. Moreover, as described above, whether each cell becomes either the read cell or the non-read cell is indicated by the pulse of FIG. 6.

FIG. 7 shows the potential relationship for each position, taking the position corresponding to the cutting line of each cell of FIG. 2 in the horizontal axis, and taking the potential with reference to the hole in the vertical axis. From the left side to the right side in FIG. 7, the potentials in the substrate at the positions of one end side of the carrier pocket (PKT) 10, the source (S), the other end side of the carrier pocket (PKT) 10, the transfer gate portion (TX) 6b (transfer channel RT portion), the accumulation well region (PD), the LOD gate (LOD) 12 (unwanted charges discharge channels RL portion) and the OD contact region (Sub) are shown.

Moreover, FIG. 8 shows changes of the driving voltage for each period. In FIG. 8, the dashed lines show changes of the driving voltage of a select line. FIG. 8 shows the changes of the driving voltage for each period, however the actual driving sequence differs from the order of the period to set differ. FIG. 8 shows a setup of the driving voltage shown in FIG. 7 in time order. In addition, as for the blanking period, in FIG. 8, the driving voltage of the read cell is shown with the dashed line and the driving voltage of the non-read cell is shown with the solid line.

The potential of each part changes corresponding to the driving voltage. For example, if the source voltage and the drain voltage or the like are increased or decreased, the potential of the surroundings will increase or decrease as well. For example, the potential of the accumulation well 4 is influenced mainly by both the applied voltages to the source and to the drain of the modulation transistor TM. Moreover, the potential of the modulation well 5 will be increased or decreased mainly corresponding to the ups and downs of the gate voltage of the modulation transistor TM.

In the present embodiment, the same drive is carried out for all the cells in the single accumulating period Sa shown in FIG. 7(A). As also shown in FIG. 8, in the single accumulating period Sa shown in FIG. 7(A), 1.5 V is applied to the ring transfer gate (RG) 6, 1.0 V is applied to the LOD gate 12, 1.0 V is applied to the drain D, and 1.0 V is applied to the source. The drain voltage is set to a relatively low value.

In the single accumulating period, the potential barrier of the transfer channel RT between the accumulation well 4 and the modulation well 5 is made high enough by the transfer transistor TT. Moreover, the potential barrier of the unwanted charges discharge channel RL between the accumulation well 4 and the OD contact region 11 is made high enough by the LOD transistor TL. Furthermore, the potential of the potential barrier of the transfer channel RT is made higher than the potential of the potential barrier of the unwanted charges discharge channel RL. The accumulation well 4 is set at a relatively high concentration, and its potential before the accumulation of the charges is relatively low. When the accumulation is started, the charges are generated by light entering from the opening region 2 of the photo diode PD, and are accumulated in the accumulation well 4. FIG. 7(A) shows the potential increase by the accumulation of the charges, with a satin pattern.

In the present embodiment, the potential barriers of the unwanted charges discharge channel RL and the potential barrier of the transfer channel RT are sufficiently high (potential is high), and the charges generated by incident light are accumulated in the accumulation well 4, without being transferred to the modulation well 5. Since the potential barrier of the transfer channel RT is higher than the potential barrier of the unwanted charges discharge channel RL, even if extremely strong light enters, the charges which overflow from the accumulation well 4 are discharged to the OD contact region 11 through the unwanted charges discharge channel RL, and will not flow into the modulation well 5.

In the transfer period shown in FIG. 7(B), 0.0 V is applied to the ring transfer gate (RG) 6, 2.5 V is applied to the LOD gate 12, 4.0 V is applied to the drain D, and 0.0 V is applied to the source.

Since 0 V is applied to the ring transfer gate 6, the potential barrier of the transfer channel RT becomes low enough. Accordingly, the charges accumulated in the accumulation well 4 in the single accumulating period Sa described above and in the parallel accumulating periods Sa, Sc, and Sn to be described later, flow into the modulation well 5 through the transfer channel RT. In addition, by setting the drain voltage to a relatively high voltage, the potential gradient is increased and thus the transfer of the charges is made easy. Moreover, in the transfer period shown in FIG. 7(B), all the cells become the read cells, and the same drive is carried out.

The reading period includes the signal modulation (S modulation) period for mainly reading the signal component (S), the noise modulation (N modulation) period for mainly reading the noise component (N), and the clear period for clearing the residual charges in order to read the noise component. By reading the signal component and the noise component so as to compare them, the picture signal, from which the cell variation and the various kinds of noises are removed, is obtained. Namely, in the reading period, the S modulation period, the clear period, and the N modulation period are carried out in this order.

The same control is carried out in the S modulation period and the N modulation period. In the S/N modulation period shown in FIG. 7(C), with respect to the read cell, as shown in the dashed line of FIG. 8, 2.5 V is applied to the ring transfer gate (RG) 6, 1.0 V is applied to the LOD gate 12, and 2.5 V is applied to the drain D. Vg–Vths (=2.5–Vths) arises at the source (Vg is the gate voltage and Vths is the threshold voltage of the channel at the time of the S modulation).

The reading is carried out for each line. Only each cell of one line (read line) out of all the lines becomes a read cell, and each cell of other lines (non-read lines) is a non-read cell. Then, upon completion of the reading of each read cell from the read line, the read line shifts, and each cell of the following line becomes a read cell, and the other cells become the non-read cells. Similarly, the reading (S modulation) of the signal component or the reading (N modulation) of the noise component is carried out with shifting the read line.

As for the read cell, the potential barrier of the transfer channel RT is made high by the transfer transistor TT so that the charges held in the modulation well 5 may not flow into the accumulation well 4. Since the voltage of the ring transfer gate 6 is made high, the source potential increases accordingly. The threshold voltage of the channel of the modulation transistor TM changes according to the charges held in the carrier pocket 10. Namely, the source potential of the modulation transistor TM becomes the one corresponding to the generated amount of the photo-generated charges, i.e., the incident light, because the photo-generated charges accumulated in the accumulation well 4 of the photo diode PD are transferred to the carrier pocket 10.

In addition, as for the non-read cell, as shown in the solid line of FIG. 8, 1.5 V is applied to the ring transfer gate (RG) 6, 1.0 V is applied to the LOD gate 12, and 2.5 V is applied to the drain D. Also in this case, Vg–Vths (=0–Vths) arises in the source, however, since the voltage of the ring transfer gate 6 is low, the level of output of the non-read cell becomes sufficiently lower than that of output of the read cell. Therefore, only the output pixel signal of the read cell appears at the source line.

In addition, since the difference in potential applied to the ring transfer gate 6 between the read cell and the non-read cell is made high enough, even if, for example, the picture is dark or the like, the output pixel signal of the read cell can be taken out from the source line securely.

In the clear period shown in FIG. 7(D), as for the read cell, as shown in the dashed line of FIG. 8, 7.0 V is applied to the ring transfer gate (RG) 6, 1.0 V is applied to the LOD gate 12, 5.0 V is applied to the drain D, and 5.0 V is applied to the source.

By applying a sufficiently high voltage to the ring gate portion (RG) 6, the drain D, and the source, the potential of the modulation well 5 is made high enough so as to discharge the residual charges to the substrate 1a through the N layer 21' under the modulation well 5. Accordingly, the photo-generated charges in the modulation well 5 are removed, thereby enabling the reading (noise modulation) of the noise component.

Meanwhile, as for the non-read cell, as shown in the solid line of FIG. 8, 1.5 V is applied to the ring transfer gate (RG) 6, 1.0 V is applied to the LOD gate 12, 5.0 V is applied to the drain D, and 5.0 V is applied to the source. Since the ring gate portion (RG) 6 is set to a low voltage, the photo-generated charges accumulated in the modulation well 5 are not discharged.

The reading of the non-read cell after the blanking period passed out of the cells per line has already been completed in FIG. 6, however, as for the non-read cells of the line before the blanking period passes, the reading has not been carried out yet. Then, in the non-read cells, the charges are prevented from being discharged from the modulation well 5. The satin-pattern portion with respect to the non-read cell of FIGS. 7(C) and (D) indicates that the charges which have not been read is held in the modulation well 5.

According to the present embodiment, as described above, the parallel accumulation operation is carried out in the S/N modulation period and the clear period. FIGS. 7(C) and (D) show this parallel accumulation operation. Namely, in the reading period (S/N modulation and clear period), the photo-generated charges are accumulated in the accumulation well 4 by increasing the potential barrier of the transfer channel RT and the unwanted charges discharge channel RL. Accordingly, the reading period (modulation period and clear period) of the modulation transistor TM will be the accumulating period (parallel accumulating periods Ss, Sn, and Sc) for accumulating the photo-generated charges at the photo diode PD side. In addition, in the parallel accumulating period Ss and Sn of FIG. 7(C), and the parallel accumulating period Sc of FIG. 7(D), the drain voltage is higher as compared with the single accumulating period Sa, and thus the conditions of accumulating the photo-generated charges differ. Moreover, as shown in FIGS. 7(C) and (D), the conditions of accumulating the photo-generated charges differ slightly between the read cell and the non-read cell.

Thus, in the single accumulating period Sa, the S/N modulation period, and the clear period, accumulation of the photo-generated charges are carried out in all the cells, and the accumulation time for each cell will be approximately one frame period as shown in FIG. 6. In this manner, the accumulation well 4 for accumulating the charges which is formed on the photo diode PD side, and the modulation well 5 which is formed on the modulation transistor TM side are separately constituted, and the potential barrier of the transfer channel RT between both is controlled by the transfer transistor TT. Accordingly, the accumulation well 4 and the modulation well 5 can be set in the reading period and the parallel accumulating period during the same period, and thus the frame rate can be increased.

The PD clear period, which is an initialization period, shown in FIG. 7(E) is adopted in the high-speed shutter mode or in the low-speed shutter mode to be described later. As shown in FIG. 8, 1.5 V is applied to the ring transfer gate (RG) 6, 0.0 V is applied to the LOD gate 12, 4.0 V is applied to the drain D, and the source impedance is made high. In addition, the driving voltage when PD clear period is used in the normal mode is also the same as that of FIG. 7(E).

The potential barrier of the unwanted charges discharge channel RL is made low enough by lowering the voltage applied to the LOD gate, and the unwanted charges accumulated in the accumulation well 4 are discharged from the unwanted charges discharge channel RL to an external signal line through the OD contact region 11. In addition, when PD clear operation is adopted in a normal mode as shown in FIG. 6, the residual charges will not be left in the modulation well 5 portion of FIG. 7(E).

In the S/N modulation period, the larger the difference in voltages applied to the ring transfer gate (RG) 6 of the read cell and that of non-read cells, the more securely reading from the read cell can be implemented. If the voltage applied to the ring transfer gate (RG) 6 of non-read cell is set to 0V, however, there may be concern that the potential barrier in the transfer channel RT is also decreased such that charges in the accumulation well 4 flow into the modulation well 5, since the gates of the modulation transistor TM and the transfer transistor TT are formed integrally with each other. Thus, in the present embodiment, a voltage of 1.5 V is applied to the ring transfer gate portion 6 for non-read cells.

Driving Sequence

Next, the operation sequence regarding each mode of the normal mode, the high-speed shutter mode and the low-speed shutter mode will be described.

Figures 10A, 10B:
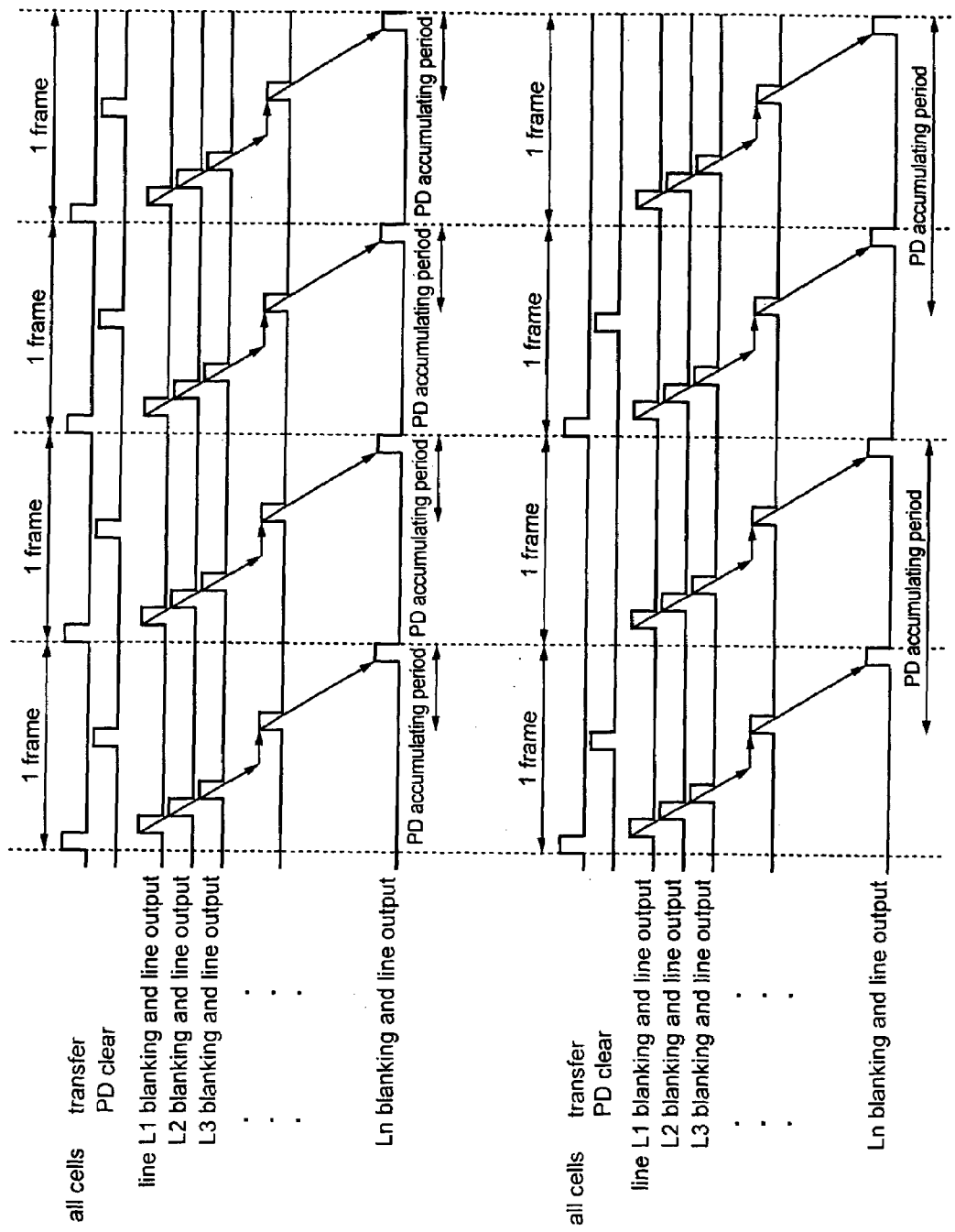
FIGS. 10A–B are timing charts showing a driving sequence.

FIGS. 9 and 10 are timing charts showing the driving sequences. FIG. 9 shows the normal mode, FIG. 10(A) shows the high-speed shutter mode, and FIG. 10(B) shows the low-speed shutter mode.

In the normal mode of FIG. 9, the same operation as that of FIG. 6 described above is carried out. In addition, the PD clear period is omitted in the normal mode of FIG. 9. Moreover, in FIG. 9 and FIG. 10, the single accumulating period Sa (line-out period) and the blanking period of FIG. 6 are combined to be shown as one pulse shape. In addition, as described above, the single accumulating period Sa is the time required for transferring data from the line memory, and actually needs more time than the blanking period.

In the normal mode of FIG. 9, a period obtained by removing the transfer period from one frame periods the accumulating period in each cell, and the reading from all the cells completes in one frame period. Since the parallel accumulating period is set up using time common to the blanking period, it is not necessary to prepare another period for the accumulation, and thereby the frame rate can be increased.

FIG. 10(A) shows the driving sequence in the high-speed shutter mode.

The high-speed shutter mode is used, for example, for shortening the accumulating period. In addition, in the conventional examples, since the residual charges of the first well are discharged upon completion of the blanking, the high-speed shutter mode or the like according to the present embodiment cannot be implemented.

For example, when extremely bright light is incident upon the photo diode PD, the amount of the charges which flows into the modulation well 5 of each cell increases extremely, and the picture based on the pixel signal read from each cell will be whitish (bright) as a whole and the contrast thereof will degrade. In such a case, the high-speed shutter mode is adopted. In the high-speed shutter mode, as shown in FIG. 10(A), the PD clear period is set at an arbitrary position in one frame period. As described above, the accumulating period is a period from the completion of the PD clear in the preceding frame to the starting time of the transfer period.

As shown in FIG. 7(E), in the PD clear period, the charges accumulated in the accumulation well 4 are discharged to the outside through the OD contact region 11. Accordingly, the photo-generated charges generated after the completion of PD clear period are accumulated in the accumulation well 4. After the completion of the PD clear period, the single accumulating period Sa and the parallel accumulating periods Ss, Sc, and Sn are cyclically repeated until the completion of the frame period. Thus, after the accumulation is carried out only for the time shorter than the one frame period that corresponds to the position of the PD clear period, the photo-generated charges accumulated in the accumulation well 4 are transferred to the modulation well 5 in the transfer period at the beginning of the frame.

The reading in the high-speed shutter mode is the same as that in the normal mode, and while the read line sequentially shifts, the reading of all lines completes in one frame period. In addition, as for the cell where the reading has not been completed, as shown in FIG. 7(E), the charges being held in the modulation well 5, and can be read in one frame period regardless of the accumulating period based on the position of the PD clear period.

For example, in the case that the PD clear period is set at the approximate center of one frame period, the accumulating period will be about a half of one frame period, and the amount of the charges which flow into the modulation well 5 will be about a half of that of the normal mode, and the brightness of the picture based on the pixel signal read from each cell can be made adequate. Thereby, a picture having sufficient contrast, though it is bright, can be obtained.

In addition, since the PD clear period can be easily set up by applying the driving voltage shown in FIG. 8 to each part, the PD clear period can be arranged in an arbitrary position corresponding to the brightness of the picture. Therefore, the accumulating period can be set up without restraint, and the pixel signal having an optimal level corresponding to the brightness of the picture can be obtained from each cell.

FIG. 10(B) shows the driving sequence in the low-speed shutter mode.

The low-speed shutter mode is used, for example, for making the accumulating period longer than one frame period. For example, when light incident upon the photo diode PD is dark, the amount of the charges which flow into the modulation well 5 of each cell will decrease, and the picture based on the pixel signal read from each cell will be dark as a whole. In such a case, the low-speed shutter mode is adopted. In the low-speed shutter mode, while the PD clear period is set once per a plurality of frame periods, the transfer period is set once per a plurality of frame periods.

In an example of FIG. 10(B), the PD clear period is set once per two frame periods, and the transfer period is set at the leading timing of the frame which is after one and half frame periods after the completion of this PD clear period. Therefore, the accumulating period in this case will be one and a half frame periods. Thereby, a picture having approximately one and a half times brightness as compared with the normal mode can be obtained. In addition, in the case of FIG. 10(B), the reading from each cell will be carried out only once per two frame periods, such that the frame rate will be a half of the normal mode.

By adopting the shutter mode of FIGS. 10(A) and (B), the accumulating period can be set up without restraint, and the optimal picture corresponding to the brightness of incident light can be obtained.

In addition, also in the low-speed shutter mode, the reading is carried out within approximately one frame period after the transfer period. Conventionally, the accumulated photo-generated charges are also discharged by reading, therefore, in the following one frame period after reading, a dummy-reading involving the clear operation which does not contribute to the picture signal, cannot be carried out. On the other hand, in the present embodiment, since the reading operation can be carried out simultaneously with the accumulation of the photo-generated charges, the dummy-reading involving the clear operation can be carried out even in the following one frame period after reading. Accordingly, there is an advantage that the configuration of the logic circuit for performing the reading operation can be simplified.

ADVANTAGEOUS EFFECT OF THE EMBODIMENT

Thus, in the present embodiment, the accumulation well 4 for accumulating the photo-generated charges is formed in the photoelectric conversion element formation region, and the modulation well 5 which is potentially independently separated from the accumulation well 4 is formed in the modulation transistor TM formation region. Then, by providing the transfer transistor TT for controlling the potential barrier between the accumulation well 4 and the modulation well 5 and by allowing the accumulating period and the blanking period to be carried out at the same time, an increase of the frame rate is achieved.

In this case, the potential of the unwanted charges discharge channel RL is set lower than the potential of the transfer channel RT. Accordingly, in the periods other than the transfer period, the charges are not transferred between the modulation well 5 and the accumulation well 4, and even when strong light enters or the like, the photo-generated charges which overflow from the accumulation well 4 are allowed to flow to the OD contact region side 11, not to the modulation well 5 side.

Moreover, in the present embodiment, the unwanted charges including the charges that overflow from the accumulation well 4 are discharged through the external signal line coupled to the contact region 11, and thus it is not necessary to form a deep over-drain region extending from the substrate 1a to the substrate surface, and both a higher quality picture and miniaturization can be achieved satisfactorily.

In addition, since the gates of the modulation transistor TM and the transfer transistor TT are formed integrally with each other, and these transistors TM and TT are driven with a common gate line, wiring and a drive circuit can be reduced and the versatility in cell layout can be enhanced.

Figure 11:
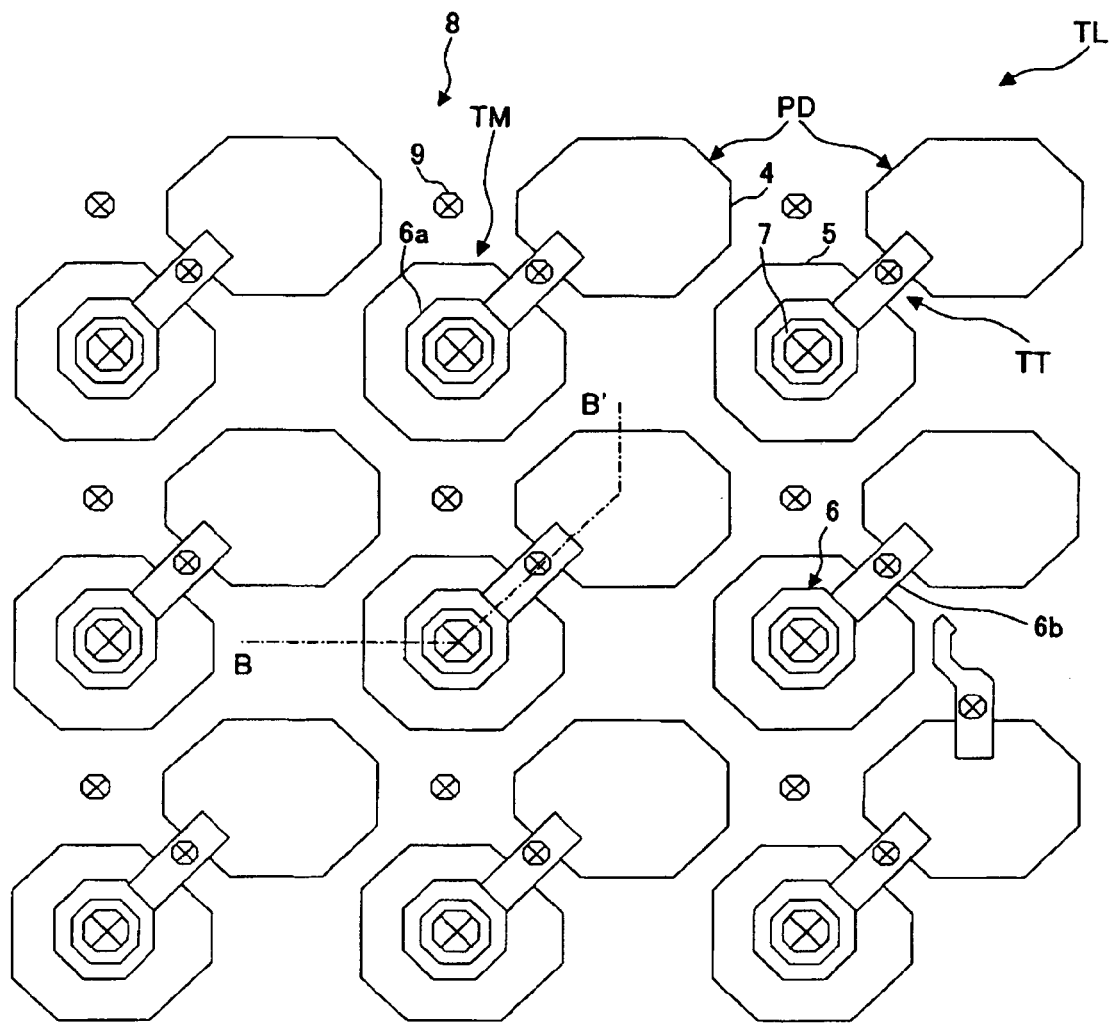
FIG. 11 is a plan view showing a planar shape of a solid state imaging device of a second embodiment.
Figure 12:
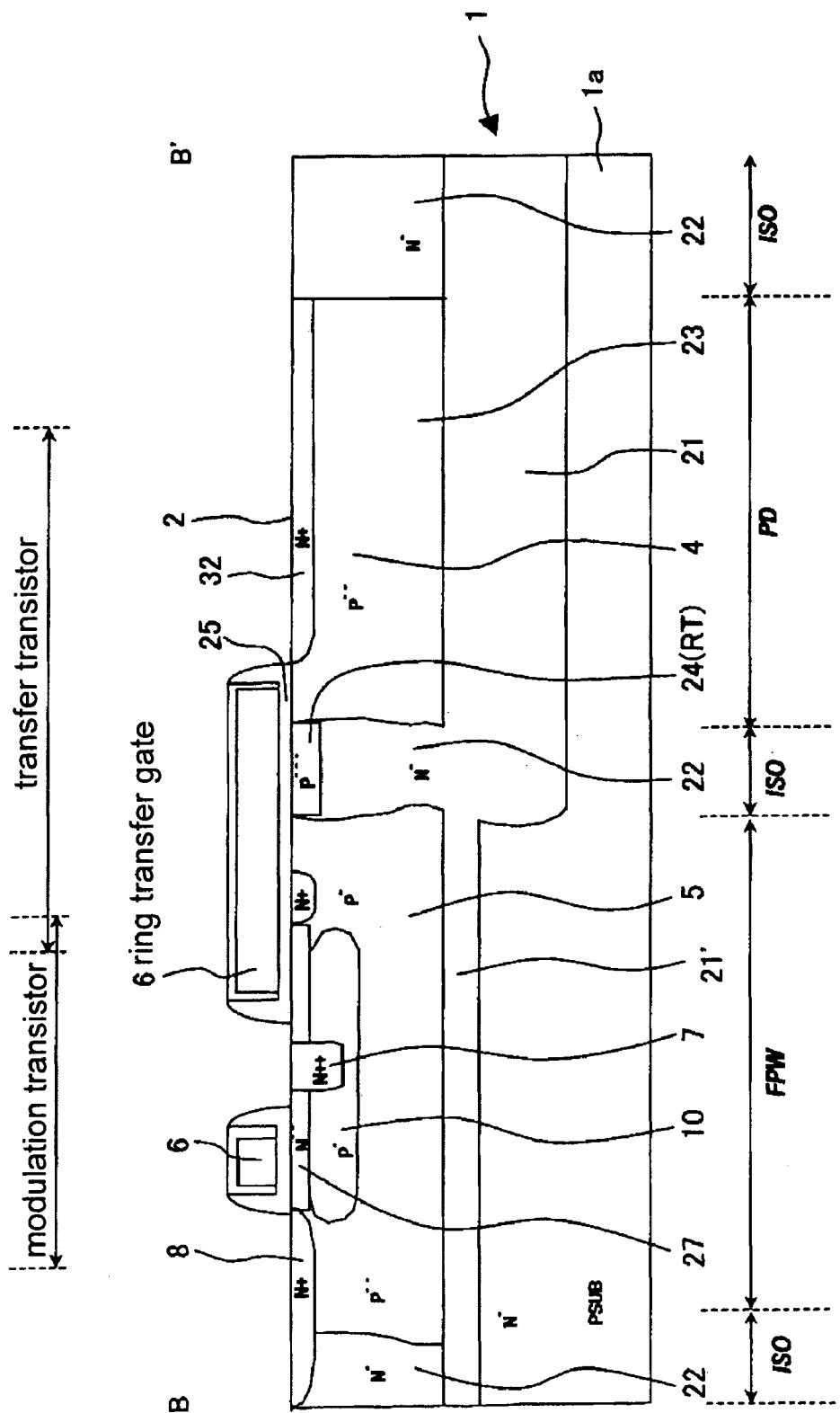
FIG. 12 is a sectional view showing the section cut along the B–B' line of FIG. 11.
Figure 13:
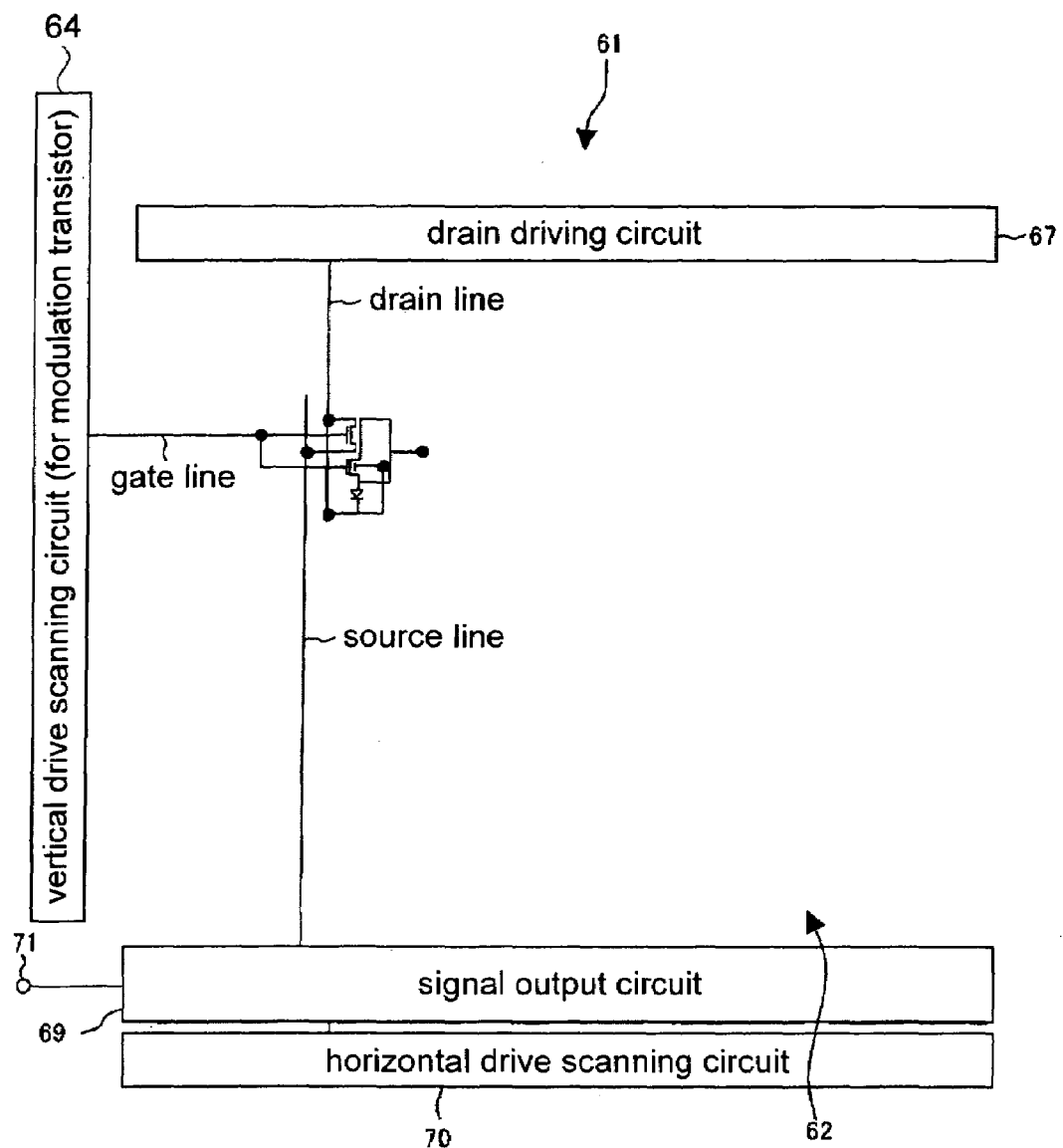
FIG. 13 is a block diagram showing the whole structure of the element of the second embodiment.
Figure 14A:
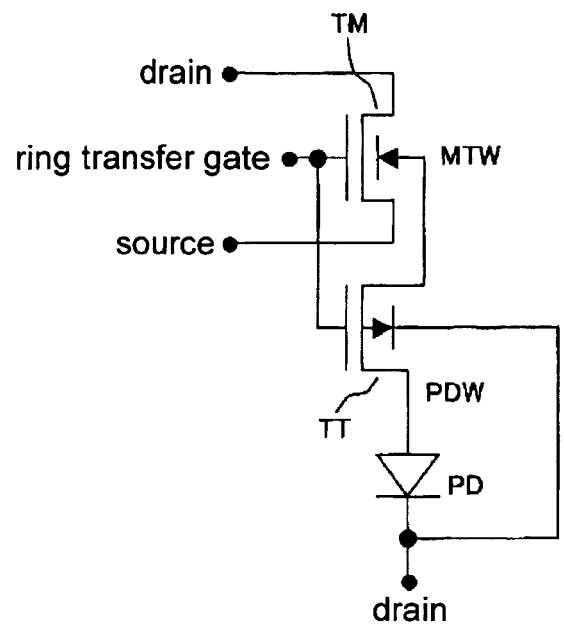
FIGS. 14A–B are equivalent circuit diagrams of the sensor cell of the second embodiment.
Figure 14B:
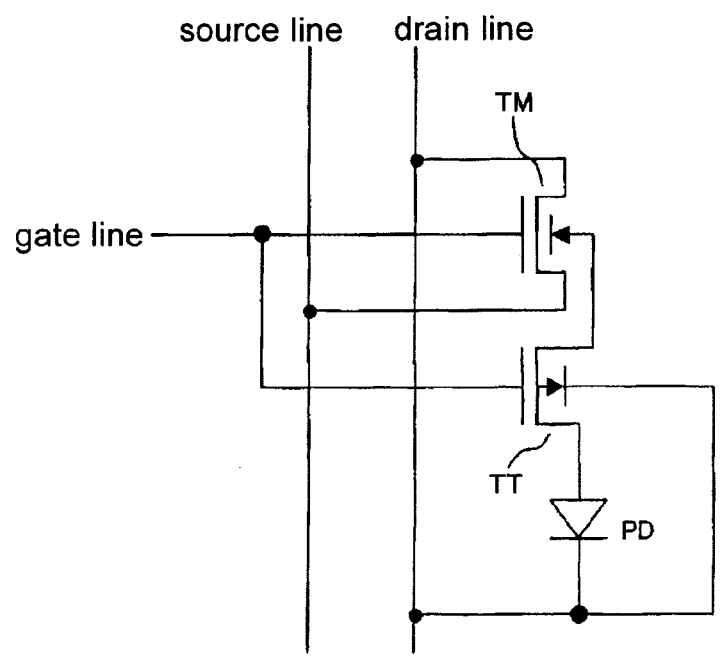
Figures 15A, 15B, 15C, 15D:
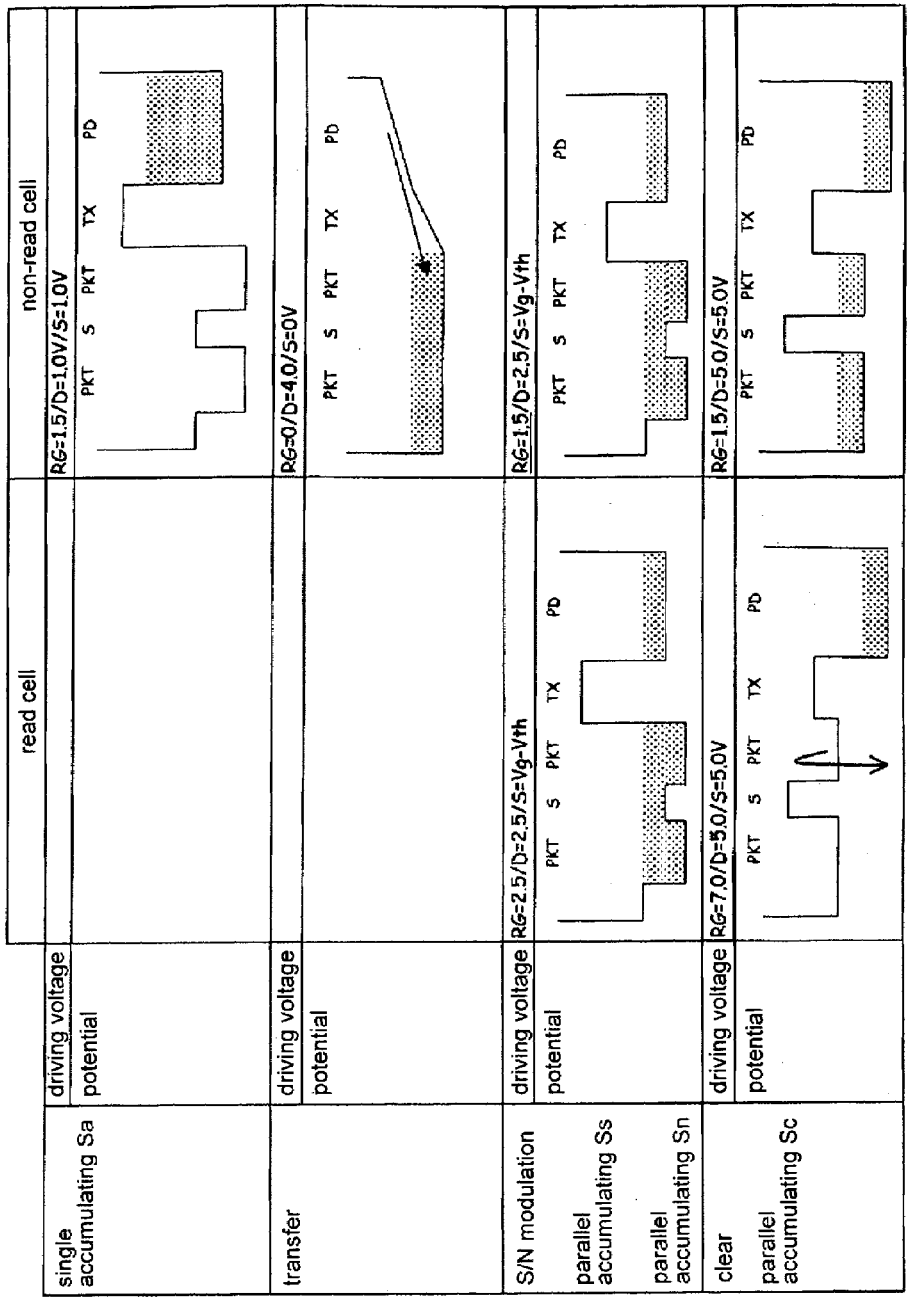
FIGS. 15A–D are diagrams showing the potential relationship for the same period of each section of the second embodiment.
Figure 16:
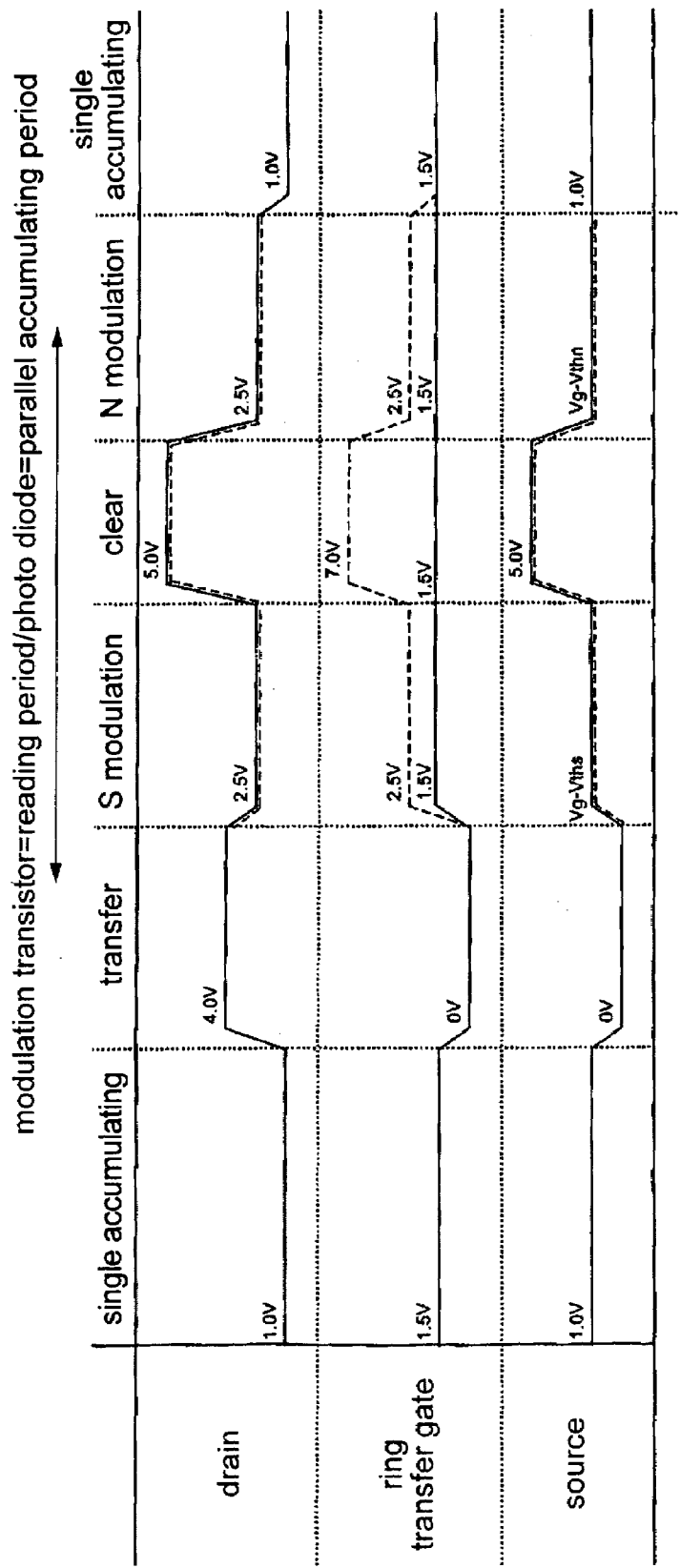
FIG. 16 is a diagram showing changes of the driving voltage in each period in the driving sequence of the second embodiment.

FIG. 11 through FIG. 17 are related to a second embodiment of the present invention, and FIG. 11 is a plan view showing a planar shape of a solid state imaging device of this embodiment, and FIG. 12 is a sectional view showing a section cut along the B–B' line of FIG. 11. FIG. 13 is a block diagram showing the entire structure of the element, and FIG. 14 is an equivalent circuit diagram of a sensor cell. FIG. 15 is an explanatory diagram showing the potential relationship for the same period of each section, and FIG. 16 is an explanatory diagram showing change of the driving voltage for each period in the driving sequence. FIG. 17 is the timing charts showing the driving sequences. In addition, in FIG. 11 through FIG. 17, the same reference numerals are given to the same elements as those of FIG. 1, FIG. 3 through FIG. 5 and FIG. 7 through FIG. 10, and the description thereof will be omitted.

In the present embodiment, the only difference from the first embodiment is that the LOD transistor TL, the OD contact region 11, and the unwanted charges discharge channel RL are omitted. Namely, as shown in FIG. 11 and FIG. 12, the unwanted charges discharge channel RL coupled to the accumulation well 4 of the photo diode PD is not formed, and the LOD transistor TL and the OD contact region 11 are not formed either. Other structure is the same as those of FIG. 1 through FIG. 3.

Even when the sensor cell constituted in this way is used, the accumulating period and the blanking period can be carried out in the same period like the first embodiment.

Namely, also in the present embodiment, the charges transfer between the modulation well 5 and the accumulation well 4 in the accumulating period can be prevented by controlling the transfer channel RT by the transfer transistor TT, and thus the photo-generated charges can be accumulated in the accumulation well 4.

In addition, in the present embodiment, since the PD clear by the LOD transistor TL cannot be carried out, the accumulating period of the accumulation well 4 is determined by the transfer period in which the potential barrier of the transfer channel RT is lowered by the transfer transistor TT. Namely, the period from the completion of the transfer period to the start of the following transfer period is the accumulating period.

Next, the circuit configuration of the whole solid state imaging device according to the present embodiment will be described with reference to FIG. 13. FIG. 14 also shows a specific circuit configuration of each sensor cell in FIG. 13.

In the present embodiment, as shown in FIG. 14, in each cell, the LOD transistor TL is omitted. Therefore, as shown in FIG. 13, the vertical drive scanning circuit 65 for driving the LOD transistor is omitted from the circuit configuration of the whole solid state imaging device.

Also in the present embodiment, the driving sequence is the same as that of FIG. 6 except that the PD clear period is not included. Namely, the accumulating period is set in a period common to all the cells. The reading period (blanking period) includes the S (signal) modulation period, the clear period, and the N (noise) modulation period. Then, also in the present embodiment, the S modulation period, the clear period, and the N modulation period in the blanking period will be, in terms of accumulation, the parallel accumulating period Ss at the time of the S modulation, the parallel accumulating period Sc at the time of the clear, and the parallel accumulating period Sn at the time of the N modulation, respectively. Moreover, the accumulating period includes, besides the parallel accumulating period in the same period as the blanking period, the single accumulating period Sa where the single accumulation operation is carried out. Thus, one frame period is constituted by cyclically repeating the single accumulating period Sa and the parallel accumulating periods Ss, Sc, and Sn, after the transfer period.

Moreover, the photo-generated charges accumulated in the accumulation well 4 are transferred, in the transfer period, from the accumulation well 4 to the modulation well 5 so as to be held. All the cells perform the transfer operation in the transfer period. Then, the period from this transfer period to the next transfer period will be the accumulating period.

Next, with reference to FIG. 15 and FIG. 16, operation in the single accumulating period Sa, the transfer period, the S modulation period (parallel accumulating period Ss), the clear period (parallel accumulating period Sc) and the N modulation period (parallel accumulating period Sn), will be described based on the potential relationship. FIG. 15 is an explanatory diagram illustrating the potential relationship for each period with defining a direction along which the hole potential becomes higher as a positive side. FIG. 15(A) shows the condition at the time of the single accumulation, FIG. 15(B) shows the condition at the time of the transfer, FIG. 15(C) shows the condition at the time of the S modulation or the N modulation (S/N modulation), and FIG. 15(D) shows the condition at the time of the clear. The column on the left side of FIG. 15 shows the condition of the read cell, and the column on the right side shows the condition of the non-read cell. In addition, FIG. 15 shows the potential change based on the charges, with a satin pattern. In addition, the timing when each cell becomes the read cell will be shown with the pulse portion of FIG. 17 as will be described later.

FIG. 15 shows the potential relationship of each position, taking the position corresponding to the cutting line of each cell of FIG. 11 in the horizontal axis, and taking the potential with reference to a hole in the vertical axis. From the left side to the right side in FIG. 15, the potentials in the substrate at the positions of one end of the carrier pocket (PKT) 10, the source (S), the other end of the carrier pocket (PKT) 10, the transfer gate portion (TX) 6b (transfer channel RT portion), the accumulation well region (PD), are shown.

Moreover, FIG. 16 shows changes of the driving voltage for each period. In FIG. 16, the dashed lines show changes of the driving voltage of the select line. FIG. 16 shows the changes of the driving voltage for each period, however the actual driving sequence differs from the order of the period to set up. FIG. 16 shows a setup of the driving voltage shown in FIG. 15 in time order.

In the present embodiment, the same drive is implemented for all the cells in the single accumulating period Sa shown in FIG. 15(A). As shown also in FIG. 16, in the single accumulating period Sa shown in FIG. 15(A), 1.5 V is applied to the ring transfer gate (RG) 6, 1.0 V is applied to the drain D, and 1.0 V is applied to the source. The drain voltage is set to a relatively low value.

In the single accumulating period, the potential barrier of the transfer channel RT between the accumulation well 4 and the modulation well 5 is made high enough by the transfer transistor TT. The accumulation well 4 is set at a relatively high concentration, and its potential before the accumulation of the charges is relatively low. When the accumulation is started, the charges are generated by light entering from the opening region 2 of the photo diode PD, and are accumulated in the accumulation well 4. FIG. 15(A) shows the potential increase by the accumulation of the charges, with a satin pattern.

Also in the present embodiment, the potential barrier of the transfer channel RT is sufficiently high (potential is high), and the charges generated by incident light are accumulated in the accumulation well 4, without being transferred to the modulation well 5.

In the transfer period shown in FIG. 15(B), 0.0 V is applied to the ring transfer gate (RG) 6, 4.0 V is applied to the drain D, and 0.0 V is applied to the source.

0 V is applied to the ring transfer gate 6, such that the potential barrier of the transfer channel RT becomes low enough. Accordingly, the charges accumulated in the accumulation well 4 in the above described single accumulating period Sa and in the parallel accumulating periods Sa, Sc, and Sn to be described later, flow into the modulation well 5 through the transfer channel RT. In addition, by setting the drain voltage to a relatively high voltage, the potential gradient is increased so as to facilitate the transfer of the charges. Also in the transfer period shown in FIG. 15(B), all the cells become read cells and the same driving is carried out.

The reading period includes the signal modulation (S modulation) period for mainly reading the signal component (S), the noise modulation (N modulation) period for mainly reading the noise component (N), and the clear period for clearing the residual charges in order to read the noise component. The picture signal from which the cell variation and the various kinds of noises are removed is obtained by reading and comparing the signal component and the noise component. Namely, in the reading period, the S modulation period, the clear period, and the N modulation period are carried out in this order.

The same control is carried out in the S modulation period and in the N modulation period. In the S/N modulation period shown in FIG. 15(C), with respect to the read cell, as shown in the dashed line of FIG. 16, 2.5 V is applied to the ring transfer gate (RG) 6, and 2.5 V is applied to the drain D. Vg–Vths (=2.5–Vths) arises in the source (Vg is the gate voltage and Vths is the threshold voltage of the channel at the time of the S modulation).

The reading is carried out for each line. Only each cell of one line (read line) out of all the lines becomes a read cell, and each cell of other lines (non-read lines) is a non-read cell. Then, upon completion of reading each read cell from the read line, the read line shifts, and each cell of the following line becomes a read cell, and the other cells become the non-read cells. Similarly, the reading (S modulation) of the signal component or the reading (N modulation) of the noise component is carried out by shifting the read line.

As for the read cell, the potential barrier of the transfer channel RT is made high by the transfer transistor TT so that the charges held in the modulation well 5 may not flow into the accumulation well 4. Since the voltage of the ring transfer gate 6 is made high, the source potential increases accordingly. The threshold voltage of the channel of the modulation transistor TM changes corresponding to the charges held in the carrier pocket 10. Namely, the source potential of the modulation transistor TM becomes the one corresponding to the generated amount of the photo-generated charges, i.e. the incident light, because the photo-generated charges accumulated in the accumulation well 4 of the photo diode PD are transferred to the carrier pocket 10.

In addition, as for the non-read cell, as shown in the solid line of FIG. 16, 1.5 V is applied to the ring transfer gate (RG) 6, and 2.5 V is applied to the drain D. Also in this case, Vg–Vth (=0–Vth) arises in the source, however, since the voltage of the ring transfer gate 6 is low, the level of output of the non-read cell becomes a level sufficiently lower than that of output of the read cell. Therefore, only the output pixel signal of the read cell appears in the source line.

In addition, the difference in potential applied to the ring gate portion 6a between the read cell and the non-read cell is made high enough, therefore, for example, even when the picture is dark or the like, the output pixel signal of the reading cell can be taken out from the source line securely.

In the clear period shown in FIG. 15(D), as for the read cell, as shown in the dashed line of FIG. 16, 7.0 V is applied to the ring transfer gate (RG) 6, 5.0 V is applied to the drain D, and 5.0 V is applied to the source.

Accordingly, the potential of the modulation well 5 is made high so as to flow the charges remaining in the modulation well 5 to the substrate 1a through the N layer 21'. Accordingly, the photo-generated charges in the modulation well 5 are removed, thereby enabling the reading (noise modulation) of the noise component.

Meanwhile, as for the non-read cell, as shown in the solid line of FIG. 16, 1.5 V is applied to the ring transfer gate (RG) 6, 5.0 V is applied to the drain D, and 5.0 V is applied to the source. Accordingly, the potential of the modulation well 5 becomes low such that the photo-generated charges are held in the modulation well 5. The reading of the non-read cell after the blanking period passes out of the cells per each line has already been completed in FIG. 6, however, as for the non-read cells of lines before the blanking period passes, the reading has not been carried out yet. Then, in the non-read cells, charges are prevented from being discharged from the modulation well 5. The satin-pattern portion with respect to the non-read cell of FIG. 15 shows that the charges which have not been read are held in the modulation well 5.

According to the present embodiment, as described above, the parallel accumulation operation is carried out in the S/N modulation period and the clear period. FIGS. 15(C) and (D) show this parallel accumulation operation. Namely, in the reading period (S/N modulation and clear period), the photo-generated charges are accumulated in the accumulation well 4 by increasing the potential barrier of the transfer channel RT. Accordingly, the reading period (modulation and clear period) of the modulation transistor TM will be the accumulating period (parallel accumulating periods Ss, Sn, and Sc) for accumulating the photo-generated charges on the photo diode PD side. In addition, in the parallel accumulating period Ss and Sn of FIG. 15(C), and the parallel accumulating period Sc of FIG. 15(D), the drain voltage is higher as compared with the single accumulating period Sa, and thus the conditions of accumulating the photo-generated charges differ. Moreover, as shown in FIGS. 15(C) and (D), the conditions of accumulating the photo-generated charges differ slightly between the read cell and the non-read cell.

Thus, in the single accumulating period Sa, the S/N modulation period, and the clear period, accumulation of the photo-generated charges is carried out in all the cells, and the accumulation time for each cell will be approximately one frame period. In this way, the accumulation well 4 for accumulating the charges that is formed on the photo diode PD side, and the modulation well 5 formed on the modulation transistor TM side are separately constituted, and the potential barrier of the transfer channel RT between both is controlled by the transfer transistor TT. Accordingly, the accumulation well 4 and the modulation well 5 can be set in the reading period and the parallel accumulating period during the same period, and thereby the frame rate can be increased.

Next, the operation sequence of each mode of the normal mode and the low-speed shutter mode will be described.

Figures 17A, 17B:
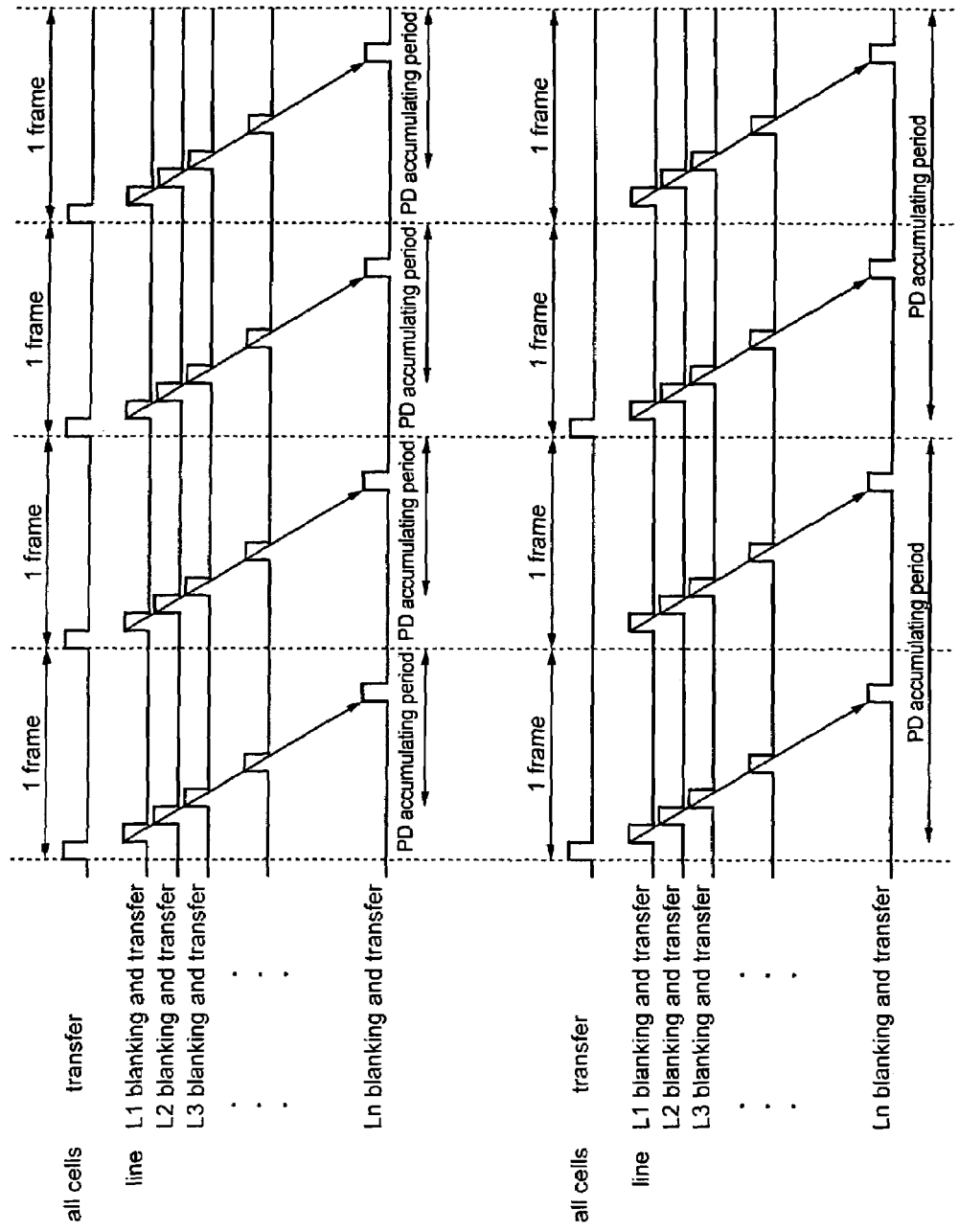
FIGS. 17A–B are timing charts showing the driving sequence of the second embodiment.

FIG. 17 is a timing chart showing the driving sequence. FIG. 17(A) shows the normal mode and FIG. 17(B) shows the low-speed shutter mode. In FIG. 17, the single accumulating period Sa (line-out period) and the blanking period are combined to be shown as one pulse shape.

In the normal mode of FIG. 17(A), a period obtained by removing the transfer period from one frame period is the accumulating period in each cell, and the reading from all the cells completes in one frame period. Since the parallel accumulating period is set up using a time common to the blanking period, it is not necessary to prepare another period for accumulation, and thereby the frame rate can be increased.

FIG. 17(B) shows the driving sequence of the low-speed shutter mode.

The low-speed shutter mode is used, for example, for making the accumulating period longer than one frame period. In the low-speed shutter mode according to the present embodiment, the transfer period is set once per a plurality of frame periods.

In an example of FIG. 17(B), the transfer period is set once per two frame periods, and the following transfer period is set up after two frame periods after the completion of this transfer period. Therefore, the accumulating period in this case will be two frame periods. Accordingly, a picture having almost twice the brightness as compared with the normal mode can be obtained. In addition, in the case of FIG. 17(B), the reading from each cell will be carried out only once per two frame periods, and the frame rate will be one half of the normal mode.

Thus, also in this embodiment, the same effect as the first embodiment can be obtained.

What is claimed is:

1. A solid state imaging device comprising:
    a substrate;
    a photoelectric conversion element formed in the substrate and generating photo-generated charges corresponding to incident light;
    an accumulation well accumulating the photo-generated charges;
    a modulation well storing the photo-generated charges transferred from the accumulation well;
    a modulation transistor having a channel threshold voltage controlled by the photo-generated charges stored in the modulation well, and that outputs a pixel signal corresponding to the photo-generated charges;
    a transfer control element changing a potential barrier of a transfer channel between the accumulation well and the modulation well so as to control transfer of the photo-generated charges, a control end of the transfer control element being common-coupled to a control end of the modulation transistor; and
    an unwanted charges discharge control element controlling a potential barrier of an unwanted charges discharge channel coupled to the accumulation well, the unwanted charges discharge control element discharging the photo-generated charges that overflow from the accumulation well through the unwanted charges discharge channel during a period other than a transfer period when the photo-generated charges are transferred from the accumulation well to the modulation well by the transfer control element.

2. The solid state imaging device according to claim 1, wherein the unwanted charges discharge control element determines an accumulating period of the photo-generated charges in the accumulation well by discharging the photo-generated charges accumulated in the accumulation well at a predetermined time.

3. The solid state imaging device according to claim 1, wherein the unwanted charges discharge channel is coupled to external wiring with a terminal on the substrate therebetween.

4. A method of driving a solid state imaging device, the solid state imaging device including:
    an accumulation well that accumulates photo-generated charges generated by a photoelectric conversion element corresponding to incident light;
    a modulation well that controls a threshold voltage of a channel of a modulation transistor by holding the photo-generated charges;
    a transfer control element having a control end is common-coupled to a control end of the modulation transistor, and that controls a potential barrier of a transfer channel between the accumulation well and the modulation well; and
    an unwanted charges discharge control element that controls a potential barrier of an unwanted charges discharge channel coupled to the accumulation well;

the method comprising:
    a single accumulation procedure for controlling the potential barrier of the transfer channel and the unwanted charges discharge channel with the transfer control element and the unwanted charges discharge control element, so as to accumulate the photo-generated charges by the photoelectric conversion element into the accumulation well at least so that the photo-generated charges do not flow to the modulation well through the transfer channel;
    a reading procedure including:
        a signal component modulation procedure for outputting a pixel signal corresponding to the photo-generated charges from the modulation transistor, while the photo-generated charges are held in the modulation well by controlling the potential barrier of the transfer channel with the transfer control element;
        a discharge procedure for discharging residual charges in the modulation well; and
        a noise component modulation procedure for controlling the potential barrier of the transfer channel with the transfer control element and reading a noise component from the modulation transistor after the discharge procedure;
    a parallel accumulation procedure for, during the same period as the signal component modulation procedure, the discharge procedure, and the noise component modulation procedure, controlling the potential barrier of the transfer channel and the unwanted charges discharge channel with the transfer control element and the unwanted charges discharge control element so as to accumulate the photo-generated charges by the photoelectric conversion element into the accumulation well at least so that the photo-generated charges do not flow to the modulation well through the transfer channel; and
    a transfer procedure for controlling the potential barrier of the transfer channel with the transfer control element so as to transfer the photo-generated charges accumulated in the accumulation well to the modulation well and make the photo-generated charges be held therein.

5. The method of driving a solid state imaging device according to claim 4, wherein the transfer procedure is carried out after the single accumulation procedure and the parallel accumulation procedure carried out in the same period as the reading procedure are repeated a number of times based on a number of lines per one screen.

6. The method of driving a solid state imaging device according to claim 4, further comprising an initialization procedure for controlling the potential barrier of the transfer channel and the unwanted charges discharge channel with the transfer control element and the unwanted charges discharge control element during an arbitrary period within one screen period, so as to discharge the photo-generated charges accumulated in the accumulation well through the unwanted charges discharge channel, wherein the transfer procedure is carried out after the single accumulation procedure and the parallel accumulation procedure carried out in the same period as the reading procedure are repeated the number of times based on the number of lines per one screen and the timing within the one screen period in the initialization procedure.

7. The method of driving a solid state imaging device according to claim 6, wherein a high-speed shutter mode where the period from the initialization procedure to the transfer procedure is shorter than one screen period is included.

8. The method of driving a solid state imaging device according to claim 6, wherein a low-speed shutter mode where the period from the initialization procedure to the transfer procedure is longer than one screen period is included.

* * * * *